US012707768B2

(12) United States Patent
Yang et al.

(10) Patent No.: US 12,707,768 B2
(45) Date of Patent: Aug. 11, 2026

(54) DISPLAY DEVICE

(71) Applicant: Samsung Display Co., LTD., Yongin-si (KR)

(72) Inventors: Eun A Yang, Yongin-si (KR); Han Su Kim, Seoul (KR); Jong Chan Lee, Suwon-si (KR)

(73) Assignee: Samsung Display Co., Ltd., Yongin-si (KR)

(*) Notice: Subject to any disclaimer, the term of this patent is extended or adjusted under 35 U.S.C. 154(b) by 871 days.

(21) Appl. No.: 17/984,121

(22) Filed: Nov. 9, 2022

(65) Prior Publication Data

US 2023/0207738 A1 Jun. 29, 2023

(30) Foreign Application Priority Data

Dec. 29, 2021 (KR) ........................ 10-2021-0191677

(51) Int. Cl.
*H10H 20/831* (2025.01)
*H10H 29/49* (2025.01)
*H10W 90/00* (2026.01)

(52) U.S. Cl.
CPC ........ *H10H 20/8316* (2025.01); *H10H 29/49* (2025.01); *H10W 90/00* (2026.01)

(58) Field of Classification Search
CPC ...... H10H 29/37; H10H 20/852; H10H 29/03; H10H 29/142; H10H 20/8316; H10H 20/857; H10H 29/49; H10H 29/857; H10H 29/922; H10H 29/14; H10H 29/942; H10H 20/8314; H01L 25/0753; H10W 90/10; H10W 90/15; H10W 90/155; H10W 90/00
See application file for complete search history.

(56) References Cited

U.S. PATENT DOCUMENTS 8,872,214 B2 10/2014 Negishi et al.
9,112,112 B2 8/2015 Do et al.
11,848,407 B2 12/2023 Lee et al.
(Continued)

FOREIGN PATENT DOCUMENTS

JP 2021-086769 A 6/2021
KR 10-0759557 B1 9/2007
(Continued)

OTHER PUBLICATIONS

Extended European Search Report issued in corresponding application No. EP 22217040.9, dated Apr. 28, 2023, 9 pages.

*Primary Examiner* — Latanya N Crawford Eason
(74) *Attorney, Agent, or Firm* — Womble Bond Dickinson (US) LLP

(57) ABSTRACT

A display device includes: a plurality of pixels having emission areas; a first and second electrode and a second electrode in an emission area; a bank layer extending around the emission areas and having a plurality of trench portions between adjacent ones of the emission areas; a plurality of light emitting elements on the first and second electrodes; a first and second connection electrode on the first electrode and the second electrode, respectively, and in contact with at least one of the light emitting elements. Ones of the trench portions are spaced apart from each other in the first direction and are a partially depressed top surface of the bank layer, and each of the trench portions has a maximum width that is smaller than a length of the light emitting element.

20 Claims, 23 Drawing Sheets

(56) References Cited

U.S. PATENT DOCUMENTS

| | | | | |
|---|---|---|---|---|
| 12,283,580 | B2 * | 4/2025 | Kim | H01L 25/0753 |
| 2011/0089850 | A1 | 4/2011 | Shibata et al. | |
| 2021/0091050 | A1 | 3/2021 | Heo et al. | |
| 2021/0335765 | A1 | 10/2021 | Lee et al. | |
| 2022/0406763 | A1 | 12/2022 | Yang et al. | |
| 2023/0361259 | A1 * | 11/2023 | Yun | H10D 86/60 |

FOREIGN PATENT DOCUMENTS

| | | | | |
|---|---|---|---|---|
| KR | 10-2012-0042068 | A | 5/2012 | |
| KR | 10-2012-0122159 | A | 11/2012 | |
| KR | 10-2015-006798 | A | 1/2015 | |
| KR | 10-2020-0115868 | A | 10/2020 | |
| KR | 10-2021-0095774 | A | 8/2021 | |
| KR | 10-2021-0103048 | A | 8/2021 | |
| KR | 10-2021-0132271 | A | 11/2021 | |
| KR | 10-2022-0168602 | A | 12/2022 | |
| WO | WO-2020197080 | A1 * | 10/2020 | H10D 86/40 |

* cited by examiner

PX
CTD CTS SPX1 SPX2 SPX3
BNL
E1 E1'
P
ED
BP1
BP2
CNE1
CNE2
E3 E3'
RME1
RME2
EMA
E2 E2'
ROP CT1 CT2 SA

RME: RME1, RME2
CNE: CNE1, CNE2

DPA
PAS2
PAS1
RPAS
VIA
PV1
IL1
BL
SUB
E2'
E2
BNL
RME2
PAS1
CNE2
BP2
PAS1
ED
BP1
CNE1
RME1
VL1
VL2
DR3
CNE: CNE1, CNE2
RME: RME1, RME2

DPA
PAS2
PAS1
BNL
RPAS
VIA
PV1
IL1
BL
SUB
E3'
E3
P
CNE2
CNE1
PAS1
ED
BP1
BP2
RME1
RME2
VL1
CNE: CNE1, CNE2
RME: RME1, RME2
DR3

DISPLAY DEVICE

CROSS-REFERENCE TO RELATED APPLICATION

This application claims priority to and the benefit of Korean Patent Application No. 10-2021-0191677, filed on Dec. 29, 2021, in the Korean Intellectual Property Office, the content of which is incorporated herein by reference in its entirety.

BACKGROUND

1. Field

Aspects of embodiments of the present disclosure relate to a display device.

2. Description of the Related Art

The importance of display devices has steadily increased with the development of multimedia technology. In response thereto, various types of display devices, such as an organic light emitting display (OLED), a liquid crystal display (LCD), and the like have been used.

A self-light emitting display device, which is a type of device for displaying an image, includes a light emitting element. The self-light emitting display device includes an organic light emitting display device using an organic material as a light emitting material as a light emitting element, an inorganic light emitting display device using an inorganic material as a light emitting material, or the like.

SUMMARY

Aspects of the present disclosure provide a display device having a structure manufactured with reduced unnecessary repetition of processes.

However, aspects and features of the present disclosure are not restricted to those set forth herein. The above and other aspects and features of the present disclosure will become more apparent to one of ordinary skill in the art to which the present disclosure pertains by referencing the detailed description of the present disclosure given below.

According to an embodiment of the present disclosure, a display device includes: a plurality of pixels including a plurality of emission areas; a first electrode and a second electrode in the emission area, extending in a first direction, and spaced apart from each other in a second direction; a bank layer extending around a periphery of the emission areas and having a plurality of trench portions between adjacent ones of the emission areas; a plurality of light emitting elements on the first electrode and the second electrode; a first connection electrode on the first electrode and in contact with at least one of the light emitting elements; and a second connection electrode on the second electrode and in contact with the at least one of the light emitting elements. Ones of the trench portions are spaced apart from each other in the first direction and are a partially depressed top surface of the bank layer, and each of the trench portions has a maximum width that is smaller than a length of the light emitting element.

The length of the light emitting elements may be about 4 μm or more, and the maximum width of the trench portions may be about 4 μm or less.

The bank layer may have a portion extending in the second direction and may overlap the first electrode and the second electrode, and each of the trench portions may not overlap the first electrode and the second electrode.

A maximum thickness of the bank layer may be greater than a thickness of portions of the bank layer at where the trench portions are formed, and the thickness of the portions of the bank layer at where the trench portions are formed may be about 1.5 μm or more.

The display device may further include a first insulating layer on the light emitting elements and the bank layer, and the first insulating layer may have a plurality of opening holes between the emission areas and in the bank layer.

Each of the opening holes may overlap the trench portion, and the trench portion has a first trench portion overlapping the opening hole and a second trench portion may be spaced apart from the first trench portion and may not overlap the opening hole.

A distance between the first trench portion and the second trench portion may be smaller than a distance between adjacent ones of the opening holes.

The display device may further include a second insulating layer on the first insulating layer, the second insulating layer may overlap each of the trench portion and the opening hole.

Each of the opening holes may not overlap the trench portion.

Each of the opening holes may partially overlap each of the trench portions.

The display device may further include a lower insulating layer on the first electrode and the second electrode, and the bank layer and the light emitting element may be directly on the lower insulating layer.

The first connection electrode may be in direct contact with the first electrode through a first contact portion that penetrates the lower insulating layer, and the second connection electrode may be in direct contact with the second electrode through a second contact portion that penetrates the lower insulating layer.

The trench portion may have a circular shape or a slit shape extending in one direction.

According to an embodiment of the present disclosure, a display device includes: a first electrode; a second electrode spaced apart from the first electrode; a lower insulating layer on the first electrode and the second electrode; a plurality of light emitting elements on the first electrode and the second electrode on the lower insulating layer and electrically connected to the first electrode and the second electrode; a bank layer extending around a region at where the light emitting elements are arranged, the bank layer being on the lower insulating layer and having a plurality of trench portions that are partially depressed portions of a top surface of the bank layer; a first insulating layer on the light emitting elements and the bank layer, the first insulating layer having a plurality of opening holes that do not overlap the first electrode and the second electrode; a first connection electrode on the first electrode and in contact with the light emitting element; and a second connection electrode on the second electrode and in contact with the light emitting element.

Each of the trench portions may have a maximum width smaller than a length of the light emitting element.

The length of the light emitting element may be about 4 μm or more, and the maximum width of the trench portion may be about 4 μm or less.

A thickness of a portion of the bank layer at where the trench portion is not formed may be greater than a thickness of portions of the bank layer at where the trench portions are formed. A maximum thickness of the bank layer may be about 2 μm or more, and the thickness of the portion of the bank layer at where the trench portions are formed may be about 1.5 μm or more.

Each of the opening holes may overlap the trench portion, and the trench portion may have a first trench portion overlapping the opening hole and a second trench portion spaced apart from the first trench portion without overlapping the opening hole.

The display device may further include a second insulating layer on the first insulating layer, and the second insulating layer may overlap the trench portions and the opening holes and may be in direct contact with a top surface of the bank layer through the opening hole.

The first connection electrode may be on the first insulating layer and the second insulating layer, and the second connection electrode may be between the first insulating layer and the second insulating layer.

The display device, according to embodiments of the present disclosure, includes trench portions formed around a region to which ink is sprayed (or deposited) during a manufacturing process, thereby increasing the volume of the sprayed ink.

The display device, according to embodiments of the present disclosure, allows for shortened ink spraying and ink drying processes performed in a process of aligning light emitting elements.

However, the aspects and features of the present disclosure are not limited to the aforementioned aspects and features, and various other aspects and features are included and described herein.

BRIEF DESCRIPTION OF THE DRAWINGS

The above and other aspects and features of the present disclosure will become more apparent by describing, in detail, embodiments of the present disclosure with reference to the attached drawings, in which.

DETAILED DESCRIPTION

Figure 1:
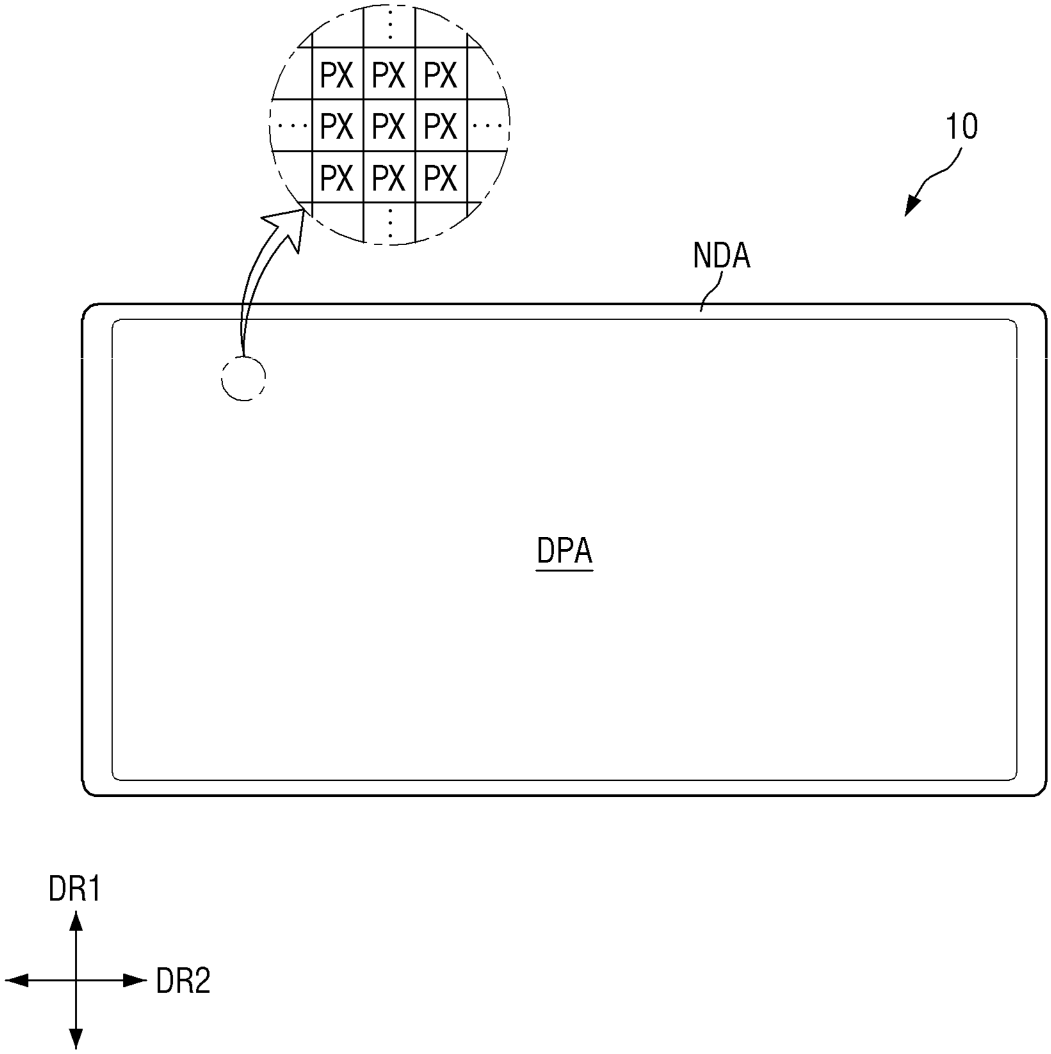
FIG. 1 is a schematic plan view of a display device according to one embodiment.

The present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms "first," "second," etc. may be used herein to describe various elements, these elements should not be limited by these terms. These terms are only used to distinguish one element from another element. For instance, a first element discussed below could be termed a second element without departing from the present disclosure. Similarly, the second element could also be termed the first element.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, embodiments will be described with reference to the accompanying drawings.

FIG. 1 is a schematic plan view of a display device according to one embodiment.

Referring to FIG. 1, a display device 10 displays (e.g., is configured to display) a moving image or a still image. The display device 10 may be any electronic device providing (or including) a display screen. Examples of the display device 10 may include a television, a laptop computer, a monitor, a billboard, an Internet-of-Things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder, and the like that provide a display screen.

The display device 10 includes a display panel which provides (e.g., includes) a display screen. The display panel may be an inorganic light emitting diode display panel, an organic light emitting diode display panel, a quantum dot light emitting display panel, a plasma display panel, and a field emission display panel. In the following description, the display device 10 will be described as being an inorganic light emitting diode display panel, but the present disclosure is not limited thereto, and aspects and features of the present disclosure may be applied to other suitable display panels.

The shape of the display device 10 may be variously changed. For example, the display device 10 may have a shape, such as a rectangular shape elongated in a horizontal direction (in the figure), a rectangular shape elongated in a vertical direction (in the figure), a square shape, a quadrilateral shape with rounded corners (e.g., vertices), another polygonal shape, and a circular shape. The shape of a display area DPA of the display device 10 may be similar to the overall shape of the display device 10. In FIG. 1, the display device 10 has a rectangular shape elongated in a second direction DR2.

The display device 10 may have the display area DPA and a non-display area NDA. The display area DPA is an area where a screen can be displayed, and the non-display area NDA is an area where a screen is not displayed (or present). The display area DPA may be referred to as an active region, and the non-display area NDA may be referred to as a non-active region. The display area DPA may substantially occupy the center of the display device 10.

The display area DPA may include a plurality of pixels PX. The plurality of pixels PX may be arranged in a matrix. The shape of each pixel PX may have a rectangular or square shape in a plan view. However, the present disclosure is not limited thereto, and each pixel PX may have a rhombic shape in which each side is inclined with respect to one direction. The pixels PX may be arranged in a stripe type or an island type. In addition, each of the pixels PX may include one or more light emitting elements that emit (e.g., that are configured to emit) light of a specific wavelength band to display a specific color.

The non-display area NDA may be disposed around the display area DPA. The non-display area NDA may completely or partially surround (e.g., extend around a periphery of or surround in a plan view) the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
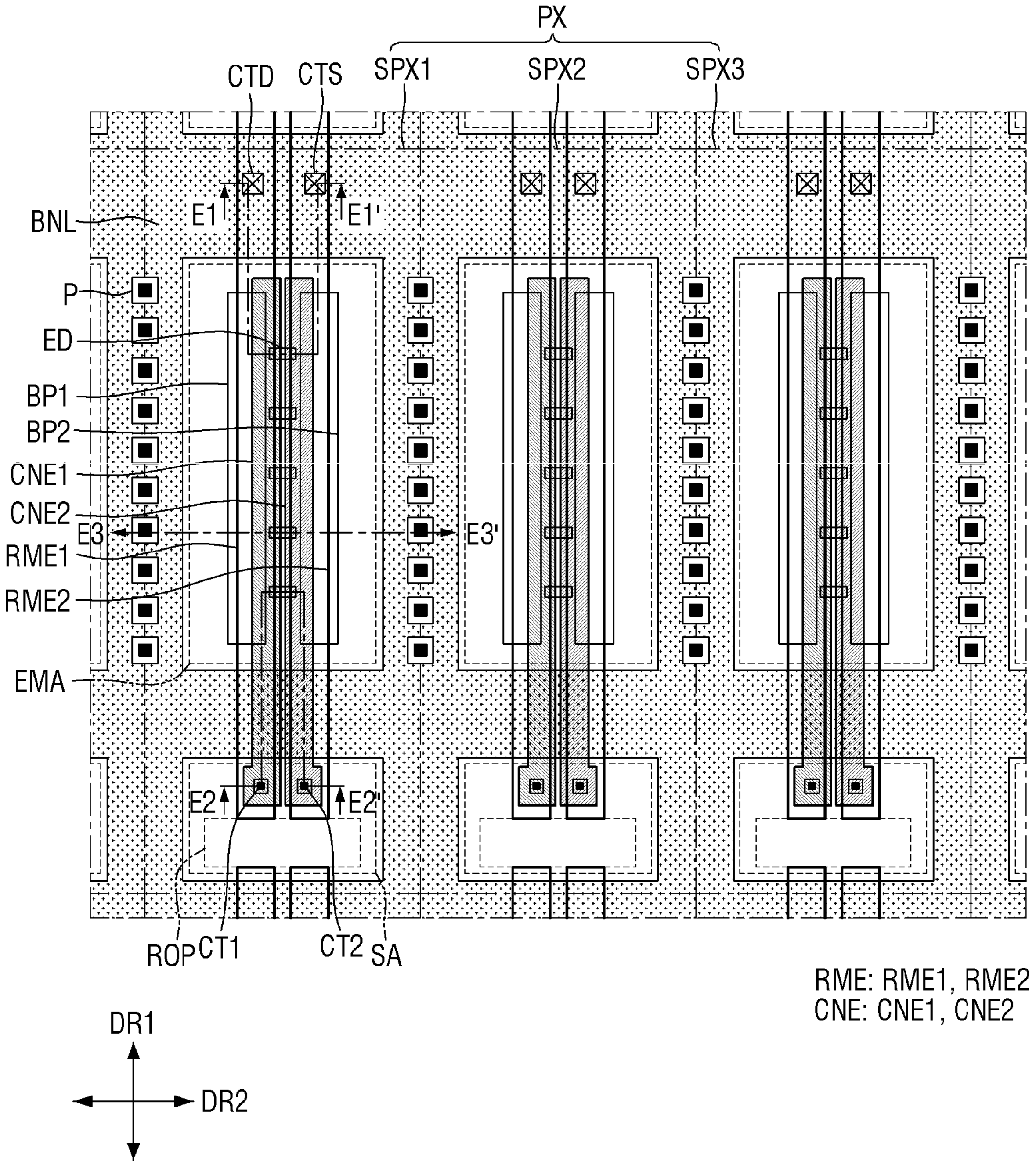
FIG. 2 is a plan view illustrating one pixel of a display device according to one embodiment.

FIG. 2 is a plan view illustrating one pixel of a display device according to one embodiment.

FIG. 2 illustrates a planar arrangement of electrodes RME (RME1 and RME2), bank patterns BP1 and BP2, a bank layer BNL, a plurality of light emitting elements ED (ED1 and ED2), and connection electrodes CNE (CNE1 and CNE2) disposed in one pixel PX of the display device 10.

Referring to FIG. 2, each of the pixels PX of the display device 10 may include a plurality of sub-pixels SPXn. For example, one pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the present disclosure is not limited thereto, and the sub-pixels SPXn may emit light of the same color. In one embodiment, each of the sub-pixels SPXn may emit blue light. Although the one pixel PX is illustrated as including three sub-pixels SPXn, the present disclosure is not limited thereto, and the one pixel PX may include a greater number of sub-pixels SPXn.

Each sub-pixel SPXn of the display device 10 may include an emission area EMA and a non-emission area. The emission area EMA may be an area in which the light emitting element ED is disposed to emit light of a specific wavelength band. The non-emission area may be a region in which the light emitting element ED is not disposed and a region from which light is not emitted because light emitted from the light emitting element ED does not reach it.

The emission area EMA may include the region in which the light emitting element ED is disposed and a region adjacent to the light emitting element ED in which the light emitted from the light emitting element ED is emitted. For example, the emission area EMA may also include a region in which the light emitted from the light emitting element ED is reflected or refracted by another member and emitted. The plurality of light emitting elements ED may be disposed in each sub-pixel SPXn, and the emission area may include an area where the light emitting elements ED are disposed and an area adjacent thereto.

Although the sub-pixels SPXn is illustrated as having emission areas EMA that are substantially identical in size, the present disclosure is not limited thereto. In some embodiments, the emission areas EMA of the sub-pixels SPXn may have different sizes according to a color or wavelength band of light emitted from the light emitting element ED disposed in each sub-pixel SPXn.

Each sub-pixel SPXn may also include a sub-region SA disposed in the non-emission area. The sub-region SA of the corresponding sub-pixel SPXn may be disposed on the lower side of the emission area EMA, which is the other side in the first direction DR1. The emission area EMA and the sub-region SA may be alternately arranged along the first direction DR1, and the sub-region SA may be disposed between the emission areas EMA of different (e.g., adjacent) sub-pixels SPXn spaced apart from each other in the first direction DR1. For example, the emission area EMA and the sub-region SA may be alternately arranged in the first direction DR1, and each of the emission area EMA and the sub-region SA may be repeatedly arranged in the second direction DR2. However, the present disclosure is not limited thereto, and the arrangement of the emission areas EMA and the sub-regions SA in the plurality of pixels PX may be different from that shown in FIG. 2.

Light may not be emitted from the sub-region SA because the light emitting element ED is not disposed in the sub-region SA, but an electrode RME disposed in each sub-pixel SPXn may be partially disposed in the sub-region SA. The electrodes RME disposed in different sub-pixels SPXn may be disposed to be separated at a separation portion ROP of the sub-region SA.

Each of the wires and the circuit elements of a circuit layer disposed on each pixel PX and connected to the light emitting diode EL may be connected to the first to third sub-pixels SPX1, SPX2, and SPX3. However, the wires and the circuit elements may not be disposed to correspond to the area occupied by each sub-pixel SPXn or the emission area EMA and may be disposed regardless of the position of the emission area EMA within one pixel PX.

The bank layer BNL may be disposed to surround (e.g., to extend around a periphery of) the plurality of sub-pixels SPXn, the emission area EMA, and the sub-region SA. The bank layer BNL may be disposed at the boundary between the sub-pixels SPXn adjacent in the first direction DR1 and the second direction DR2 and may also be disposed at the boundary between the emission area EMA and the sub-region SA. The sub-pixels SPXn, the emission area EMA, and the sub-region SA of the display device 10 may be the areas distinguished by the arrangement of the bank layer BNL. The gaps between the plurality of sub-pixels SPXn, the emission areas EMA, and the sub-regions SA may vary depending on the width of the bank layer BNL.

The bank layer BNL may include portions extending in the first direction DR1 and the second direction DR2 in a plan view to be arranged in a grid pattern over the entire surface of the display area DPA. The bank layer BNL may be disposed along the boundaries between the sub-pixels SPXn to delimit the neighboring sub-pixels SPXn. The bank layer BNL may also be arranged to surround (e.g., extend around a periphery of) the emission area EMA and the sub-region SA disposed for each sub-pixel SPXn to delimit them from each other.

Figure 3:
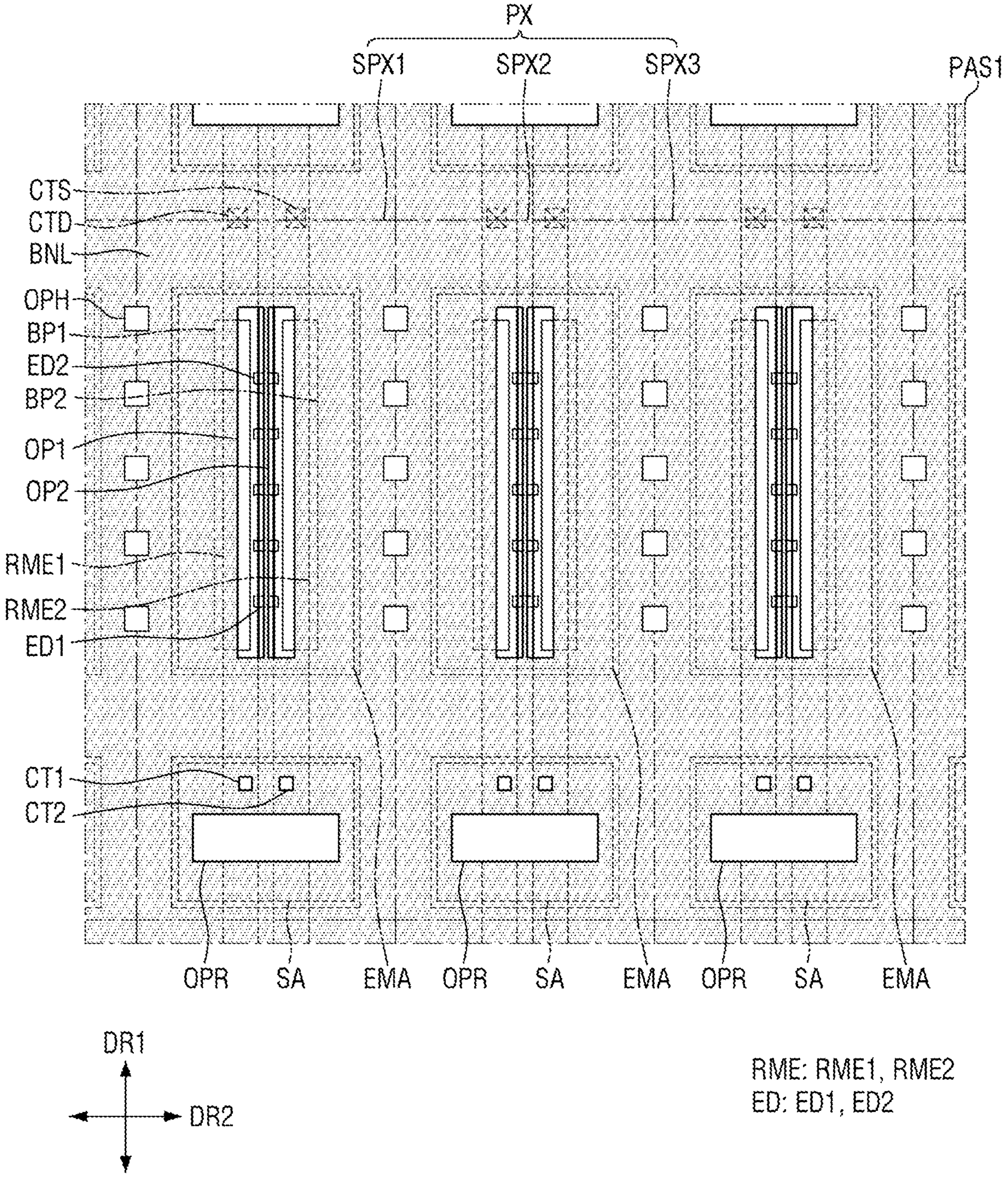
FIG. 3 is a plan view illustrating a first insulating layer disposed in one pixel of FIG. 2.
Figure 4:
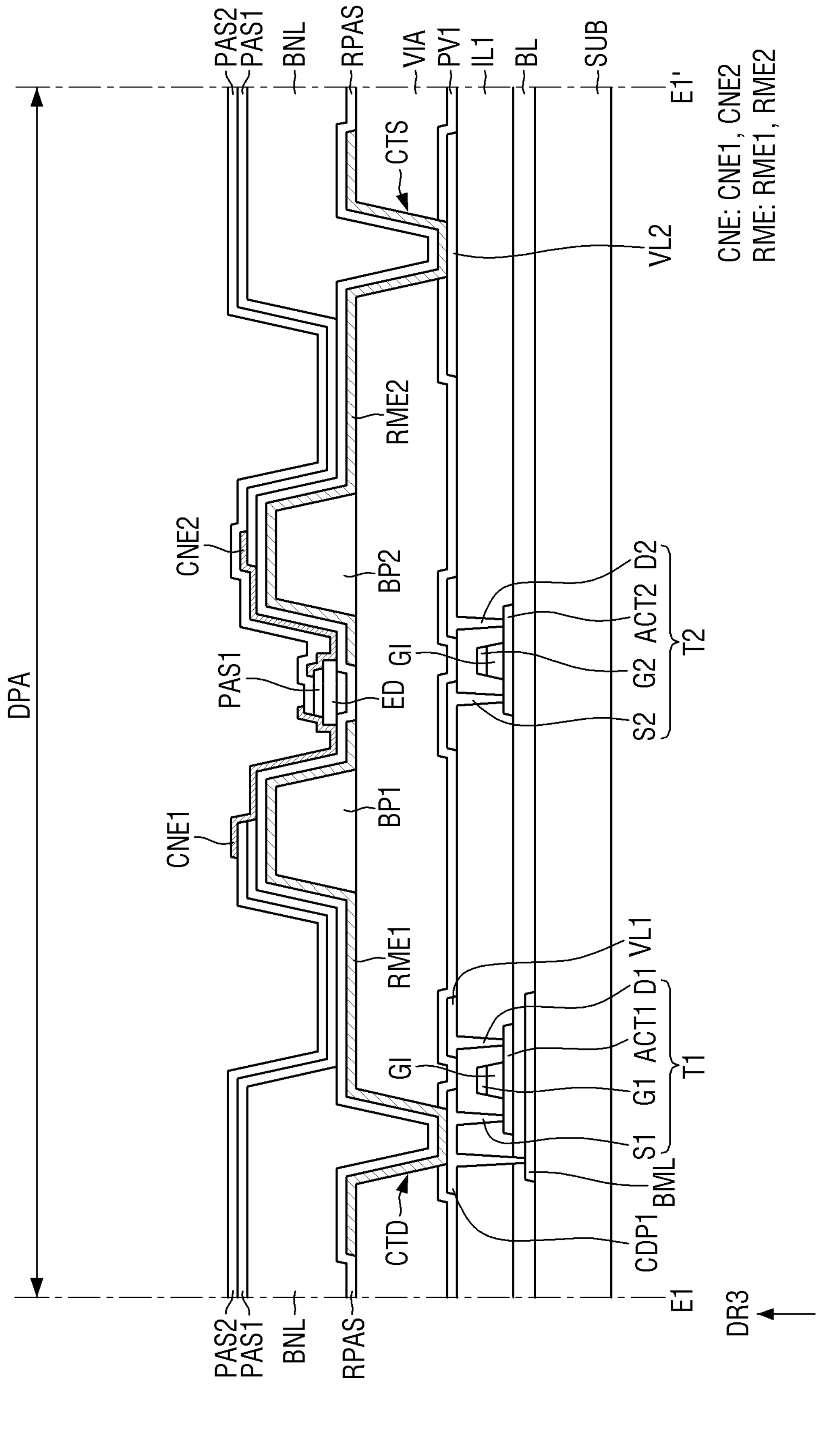
FIG. 4 is a cross-sectional view taken along the line E1-E1' of FIG. 2.
Figure 5:
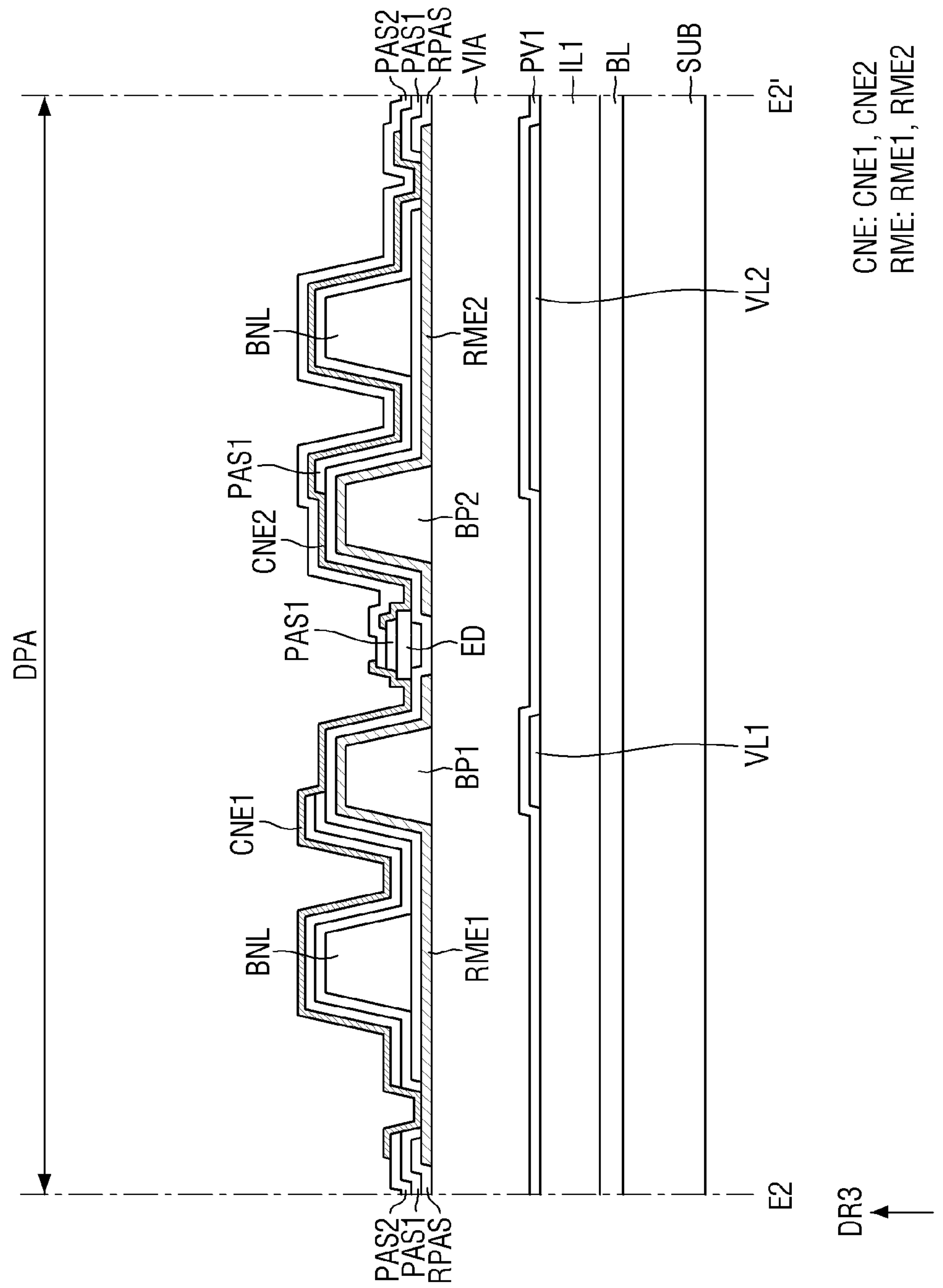
FIG. 5 is a cross-sectional view taken along the line E2-E2' of FIG. 2.
Figure 6:
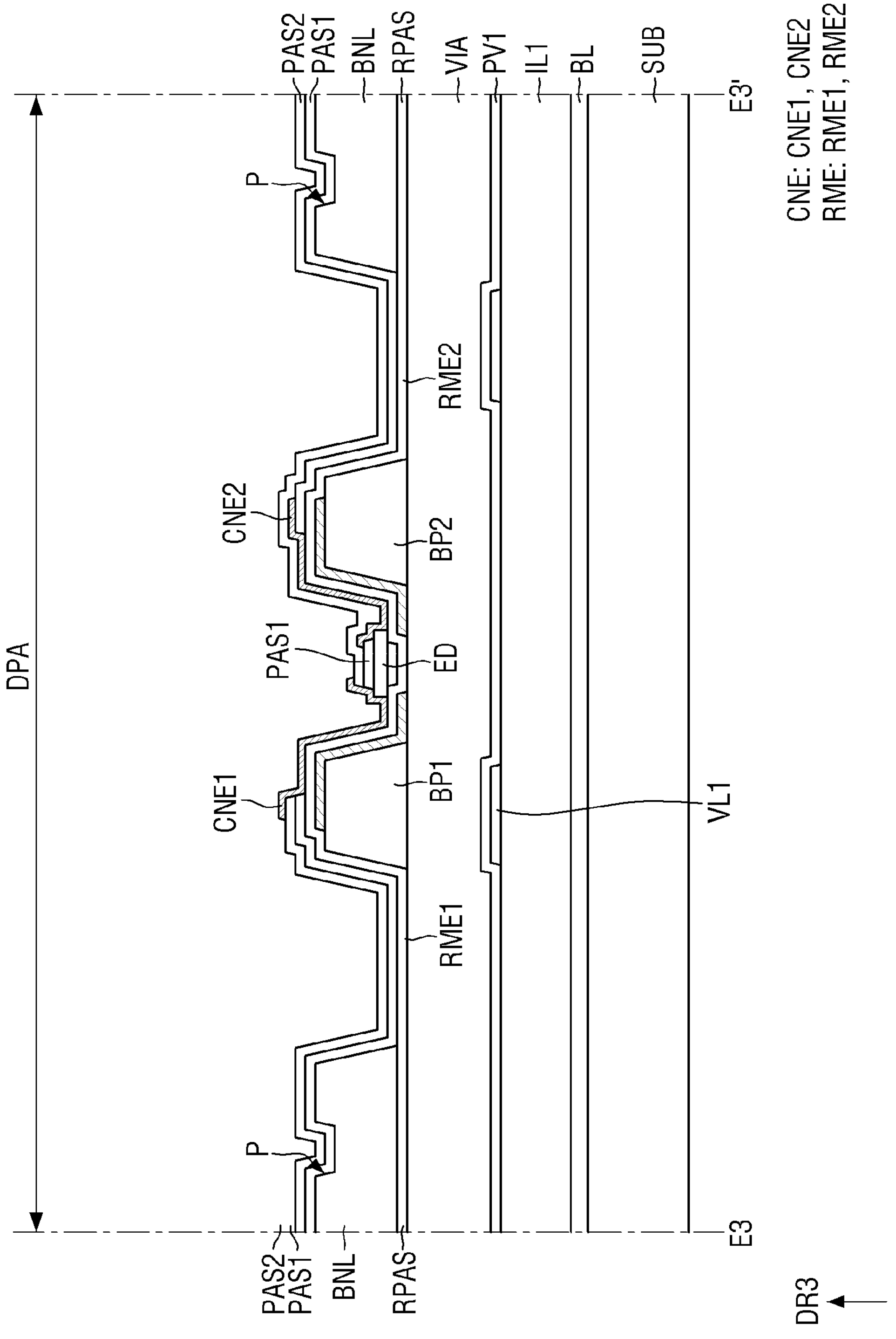
FIG. 6 is a cross-sectional view taken along the line E3-E3' of FIG. 2.

FIG. 3 is a plan view illustrating a first insulating layer disposed in one pixel shown in FIG. 2. FIG. 4 is a cross-sectional view taken along the line E1-E1' of FIG. 2. FIG. 5 is a cross-sectional view taken along the line E2-E2' of FIG. 2. FIG. 6 is a cross-sectional view taken along the line E3-E3' of FIG. 2.

FIG. 3 illustrates the relative arrangement of the first insulating layer PAS1, the electrodes RME1 and RME2, and the bank layer BNL disposed in one pixel PX in a plan view. FIG. 4 illustrates a cross section across both ends of the light emitting element ED and electrode contact holes (e.g., electrode contact openings) CTD and CTS disposed in the first sub-pixel SPX1, FIG. 5 illustrates a cross section across both ends of the light emitting element ED and contact portions CT1 and CT2 disposed in the first sub-pixel SPXn, and FIG. 6 illustrates a cross section traversing both ends of the light emitting element ED and a trench portion P formed in the bank layer BNL.

Referring to FIGS. 2 and 3 to 6, the display device 10 may include a first substrate SUB and a semiconductor layer, a plurality of conductive layers, and a plurality of insulating layers disposed on the first substrate SUB. In addition, the display device 10 may include the plurality of electrodes RME (RME1 and RME2), the light emitting element ED, and the connection electrodes CNE (CNE1 and CNE2). The semiconductor layer, the conductive layers, and the insulating layers may each form (or constitute) a circuit layer of the display device 10.

The first substrate SUB may be an insulating substrate. The first substrate SUB may be made of an insulating material, such as glass, quartz, or polymer resin. Further, the first substrate SUB may be a rigid substrate or may be a flexible substrate that can be bent, folded or rolled. The first substrate SUB may have the display area DPA and the non-display area NDA surrounding (e.g., extending around a periphery of) the display area DPA, and the display area DPA may have the emission area EMA and the sub-region SA that is a part of the non-emission area.

A first conductive layer may be disposed on the first substrate SUB. The first conductive layer includes a lower metal layer BML that is disposed to overlap a first active layer ACT1 of a first transistor T1. The lower metal layer BML may prevent light from being incident on the first active layer ACT1 of the first transistor and/or may be electrically connected to the first active layer ACT1 to stabilize the electrical characteristics of the first transistor T1. In some embodiments, however, the lower metal layer BML may be omitted.

The buffer layer BL may be disposed on the lower metal layer BML and the first substrate SUB. The buffer layer BL may be formed on the first substrate SUB to protect the transistors of the pixel PX from moisture permeating through the first substrate SUB, which are susceptible to moisture permeation, and may provide a planar surface.

The semiconductor layer is disposed on the buffer layer BL. The semiconductor layer may include the first active layer ACT1 of the first transistor T1 and a second active layer ACT2 of the second transistor T2. The first active layer ACT1 and the second active layer ACT2 may be disposed to respectively partially overlap a first gate electrode G1 and a second gate electrode G2 of a second conductive layer, to be described later.

The semiconductor layer may include polycrystalline silicon, monocrystalline silicon, oxide semiconductor, and the like. In one embodiment, the semiconductor layer may include polycrystalline silicon. The oxide semiconductor may be an oxide semiconductor containing (or including) indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

Although the first transistor T1 is illustrated as being disposed in the sub-pixel SPXn of the display device 10, the present disclosure is not limited thereto, and the display device 10 may include a greater number of transistors.

A first gate insulating layer GI is disposed on the semiconductor layer in the display area DPA. The first gate insulating layer GI may be a gate insulating layer for each of the transistors T1 and T2. In the drawings, the first gate insulating layer GI is illustrated as being patterned together with the gate electrodes G1 and G2 of the second conductive layer, to be described later, and is partially disposed between the second conductive layer and the active layers ACT1 and ACT2 of the semiconductor layer. However, the present disclosure is not limited thereto. In some embodiments, the first gate insulating layer GI may be entirely disposed on the buffer layer BL (e.g., the first gate insulating layer GI may not be patterned).

The second conductive layer is disposed on the first gate insulating layer GI. The second conductive layer may include a first gate electrode G1 of the first transistor T1 and a second gate electrode G2 of the second transistor T2. The first gate electrode G1 may be disposed to overlap the channel region of the first active layer ACT1 in a third direction DR3, that is, a thickness direction, and the second gate electrode G2 may be disposed to overlap the channel region of the second active layer ACT2 in the third direction DR3, that is, the thickness direction. Although not shown in the drawing, the second conductive layer may further include one electrode of the storage capacitor.

A first interlayer insulating layer IL1 is disposed on the second conductive layer. The first interlayer insulating layer IL1 may be an insulating film between the second conductive layer and other layers disposed thereon and may protect the second conductive layer.

A third conductive layer is disposed on the first interlayer insulating layer IL1. The third conductive layer may include the first voltage line VL1 and the second voltage line VL2, a first conductive pattern CDP1, a source electrode S1 and a drain electrode D1 of the transistor T1, and a source electrode S2 and a drain electrode D2 of the transistor T2 that are disposed in the display area DPA. The third conductive layer may further include another (e.g., the other) electrode of the storage capacitor.

A high potential voltage (e.g., a first power voltage) may be applied to the first voltage line VL1 and transmitted to a first electrode RME1, and a low potential voltage (e.g., a second power voltage) may be applied to the second voltage line VL2 and transmitted to a second electrode RME2. A part (or portion) of the first voltage line VL1 may be in contact with the first active layer ACT1 of the first transistor T1 through the contact hole (e.g., the contact opening) penetrating (e.g., extending through) the first interlayer insulating layer IL1 and the first gate insulating layer GI. The first voltage line VL1 may be a first drain electrode D1 of the first transistor T1. The second voltage line VL2 may be directly connected to the second electrode RME2, to be described later. Although the first voltage line VL1 and the second voltage line VL2 are illustrated as being disposed in the third conductive layer, the present disclosure is not limited thereto. In some embodiments, the first voltage line VL1 and the second voltage line VL2 may be disposed in the first conductive layer, and the third conductive layer may include a connection pattern electrically connected to the first voltage line VL1 or the second voltage line VL2.

The first conductive pattern CDP1 may be in contact with the first active layer ACT1 of the first transistor T1 through the contact hole (e.g., the contact opening) penetrating (e.g., extending through) the first interlayer insulating layer IL1 and the first gate insulating layer GI. The first conductive pattern CDP1 may be in contact with the lower metal layer BML through another contact hole (e.g., another contact opening). The first conductive pattern CDP1 may be a first source electrode S1 of the first transistor T1. Further, the first conductive pattern CDP1 may be connected to the first electrode RME1 or the first connection electrode CNE1, to be described later. The first transistor T1 may transmit the first power voltage applied from the first voltage line VL1 to the first electrode RME1 or the first connection electrode CNE1.

The second source electrode S2 and the second drain electrode D2 may be in contact with the second active layer ACT2 of the second transistor T2 through the contact holes penetrating the first interlayer insulating layer IL1 and the first gate insulating layer GI. The second transistor T2 may be any one of the switching transistors described with reference to FIG. 7. The second transistor T2 may transfer the signal applied from the data line DTL shown in FIG. 7 to the first transistor T1 or may transfer the signal applied from the initialization voltage line VIL shown in FIG. 7 to the other electrode of the storage capacitor.

A first passivation layer PV1 is disposed on the third conductive layer. The first passivation layer PV1 may be an insulating layer between the third conductive layer and other layers and may protect the third conductive layer.

The buffer layer BL, the first gate insulating layer GI, the first interlayer insulating layer IL1, and the first passivation layer PV1 described above may be formed of (e.g., may be formed by and/or may include) a plurality of inorganic layers stacked in an alternating manner. For example, the buffer layer BL, the first gate insulating layer GI, the first interlayer insulating layer IL1, and the first passivation layer PV1 may be formed as (e.g., may each be formed as) a double layer formed by stacking, or a multilayer formed by alternately stacking, inorganic layers including at least one of silicon oxide ($SiO_x$), silicon nitride ($SiN_x$), or silicon oxynitride ($SiO_xN_y$). However, the present disclosure is not limited thereto, and the buffer layer BL, the first gate insulating layer GI, the first interlayer insulating layer IL1, and the first passivation layer PV1 may be formed as (e.g., may each be formed as) a single inorganic layer containing (or including) the above-described insulating material. Further, in some embodiments, the first interlayer insulating layer IL1 may be made of an organic insulating material, such as polyimide (PI) or the like.

A via layer VIA is disposed on the third conductive layer in the display area DPA. The via layer VIA may contain (or including) an organic insulating material, such as polyimide (PI), and may compensate for the stepped portion formed by the conductive layers disposed thereunder to flatten the top surface. However, in some embodiments, the via layer VIA may be omitted.

The display device 10 may include, as a display element layer disposed on the via layer VIA, the bank patterns BP1 and BP2, the plurality of electrodes RME (e.g., RME1 and RME2), the bank layer BNL, the plurality of light emitting elements ED, and the plurality of connection electrodes CNE (e.g., CNE1 and CNE2). In addition, the display device 10 may include insulating layers RPAS, PAS1, and PAS2 disposed on the via layer VIA.

The plurality of bank patterns BP1 and BP2 may be disposed in the emission area EMA of each sub-pixel SPXn. The bank patterns BP1 and BP2 may have a width (e.g., a predetermined width) in the second direction DR2 and may have a shape extending in (e.g., primarily extending in) the first direction DR1.

For example, the bank patterns BP1 and BP2 may include a first bank pattern BP1 and a second bank pattern BP2 spaced apart from each other in the second direction DR2 in the emission area EMA of each sub-pixel SPXn. The first bank pattern BP1 may be disposed on the left side with respect to the center of the emission area EMA, which is one side in the second direction DR2, and the second bank patterns BP2 may be disposed on the right side with respect to the center of the emission area EMA, which is the other side in the second direction DR2, while being spaced apart from the first bank pattern BP1. The first bank pattern BP1 and the second bank pattern BP2 may be alternately disposed along the second direction DR2 and may be disposed in an island-shaped pattern in the display area DPA. The plurality of light emitting elements ED may be arranged between the first bank pattern BP1 and the second bank pattern BP2.

The lengths of the first bank pattern BP1 and the second bank pattern BP2 in the first direction DR1 may be the same (e.g., may be the same as each other) and may be smaller than the length of the emission area EMA surrounded by the bank layer BNL in the first direction DR1. The first bank pattern BP1 and the second bank pattern BP2 may be spaced apart from a portion of the bank layer BNL extending in the second direction DR2. However, the present disclosure is not limited thereto, and the bank patterns BP1 and BP2 may be integrated (or integral) with the bank layer BNL or may partially overlap the portion of the bank layer BNL extending in the second direction DR2. In such an embodiment, the lengths of the bank patterns BP1 and BP2 in the first direction DR1 may be greater than or equal to the length of the emission area EMA surrounded by (e.g., surrounded in a plan view by) the bank layer BNL in the first direction DR1.

The widths of the first bank pattern BP1 and the second bank pattern BP2 in the second direction DR2 may be the same. However, the present disclosure is not limited thereto, and they may have different widths. For example, one bank pattern may have a larger width than the other bank pattern, and the bank pattern having a larger width may be disposed across the emission areas EMA of different sub-pixels SPXn adjacent in the second direction DR2. In such an embodiment, in the bank pattern disposed across the plurality of emission areas EMA, a portion of the bank layer BNL extending in the first direction DR1 may overlap the second bank pattern BP2 in the thickness direction. Although two bank patterns BP1 and BP2 having the same width are illustrated being arranged for each sub-pixel SPXn, the present disclosure is not limited thereto. The number and the shape of the bank patterns BP1 and BP2 may vary depending on the number or the arrangement structure of the electrodes RME.

The plurality of bank patterns BP1 and BP2 may be disposed on the via layer VIA. For example, each of the bank patterns BP1 and BP2 may be directly disposed on the via layer VIA and may have a structure in which at least a part thereof protrudes with respect to (e.g., protrudes away from) the top surface of the via layer VIA. The protruding parts of the bank patterns BP1 and BP2 may have an inclined surface or a curved surface with a curvature, and some light emitted from the light emitting element ED may be reflected by the electrode RME disposed on the bank patterns BP1 and BP2 and emitted in the upward direction of (e.g., in the direction away from) the via layer VIA. Different from the embodiment illustrated in the drawing, the bank patterns BP1 and BP2 may have a shape, such as a semicircular or semi-elliptical shape, in which the outer surface is curved with a curvature in a cross-sectional view. The bank patterns BP1 and BP2 may include an organic insulating material, such as polyimide (PI) but are not limited thereto.

The plurality of electrodes RME (e.g., RME1 and RME2) have a shape extending in one direction and are disposed for each sub-pixel SPXn. The plurality of electrodes RME1 and RME2 may extend in the first direction DR1 to be disposed across the emission area EMA of the sub-pixel SPXn and the sub-region SA and may be disposed to be spaced apart from each other in the second direction DR2. The plurality of electrodes RME may be electrically connected to the light emitting element ED, to be described later, but the present disclosure is not limited thereto. The electrodes RME may not be electrically connected to the light emitting element ED.

The display device 10 may include the first electrode RME1 and the second electrode RME2 arranged in each sub-pixel SPXn. The first electrode RME1 is located on the left side with respect to the center of the emission area EMA, and the second electrode RME2 is located on the right side with respect to the center of the emission area EMA while being spaced apart from the first electrode RME1 in the second direction DR2. The first electrode RME1 may be disposed on the first bank pattern BP1, and the second electrode RME2 may be disposed on the second bank pattern BP2. The first electrode RME1 and the second electrode RME2 may be partially arranged in the corresponding sub-pixel SPXn and the sub-region SA over the bank layer BNL. The first electrode RME1 and the second electrode RME2 of different sub-pixels SPXn may be separated with respect to (e.g., may be separated at) the separation portion ROP located in the sub-region SA of one sub-pixel SPXn.

Although two electrodes RME are illustrated as having a shape extending in (e.g., primarily extending in) the first direction DR1 for each sub-pixel SPXn, the present disclosure is not limited thereto. For example, the display device 10 may have a shape in which a greater number of electrodes RME are disposed in one sub-pixel SPXn or the electrodes RME are partially bent and have different widths depending on positions.

The first electrode RME1 and the second electrode RME2 may be arranged at least on the inclined surfaces of the bank patterns BP1 and BP2. In one embodiment, the widths of the plurality of electrodes RME measured in the second direction DR2 may be smaller than the widths of the bank patterns BP1 and BP2 measured in the second direction DR2, and the gap between the first electrode RME1 and the second electrode RME2 in the second direction DR2 may be smaller than the gap between the bank patterns BP1 and BP2. At least a part of the first electrode RME1 and the second electrode RME2 may be directly arranged on the via layer VIA so that the first electrode RME1 and the second electrode RME2 may be arranged on the same plane.

The light emitting element ED disposed between the bank patterns BP1 and BP2 may emit light toward both ends of the light emitting element ED, and the emitted light may be directed toward the electrodes RME disposed on the bank patterns BP1 and BP2. The electrodes RME may have a structure in which portions thereof disposed on the bank patterns BP1 and BP2 reflect the light emitted from the light emitting element ED. The first electrode RME1 and the second electrode RME2 may be arranged to cover at least one side surfaces of the bank patterns BP1 and BP2 and may reflect the light emitted from the light emitting element ED.

The electrodes RME may be in direct contact with the third conductive layer through the electrode contact holes (e.g., electrode contact openings) CTD and CTS at the portions overlapping the bank layer BNL between the emission area EMA and the sub-region SA. The first electrode contact hole CTD may be formed in an area in which the bank layer BNL and the first electrode RME1 overlap, and the second electrode contact hole CTS may be formed in an area in which the bank layer BNL and the second electrode RME2 overlap. The first electrode RME1 may be in contact with the first conductive pattern CDP1 through the first electrode contact hole CTD penetrating the via layer VIA and the first passivation layer PV1. The second electrode RME2 may be in contact with the second voltage line VL2 through the second electrode contact hole CTS penetrating the via layer VIA and the first passivation layer PV1. The first electrode RME1 may be electrically connected to the first transistor T1 through the first conductive pattern CDP1 so that the first power voltage may be applied to the first electrode RME1, and the second electrode RME2 may be electrically connected to the second voltage line VL2 so that the second power voltage may be applied to the second electrode RME2. However, the present disclosure is not limited thereto. In another embodiment, the electrodes RME1 and RME2 may not be electrically connected to the voltage lines VL1 and VL2 of the third conductive layer, respectively, and the connection electrode CNE to be described later may be directly connected to the third conductive layer.

The plurality of electrodes RME may include a conductive material having high reflectivity. For example, the electrodes RME may contain (or include) a metal, such as silver (Ag), copper (Cu), or aluminum (Al), or may contain (or include) an alloy including aluminum (Al), nickel (Ni), lanthanum (La), or the like. In other embodiments, the electrodes RME may have a structure in which a metal layer, such as titanium (Ti), molybdenum (Mo), and niobium (Nb) and the alloy are stacked. In some embodiments, the electrodes RME may be formed as a double layer or a multilayer formed by stacking at least one metal layer made of an alloy including aluminum (Al) and titanium (Ti), molybdenum (Mo), and niobium (Nb).

The present disclosure is not limited thereto, and each electrode RME may further include a transparent conductive material. For example, each electrode RME may include a material, such as ITO, IZO, and ITZO. In some embodiments, each of the electrodes RME may have a structure in which at least one transparent conductive material and at least one metal layer having high reflectivity are stacked or may be formed as one layer including them. For example, each electrode RME may have a stacked structure of ITO/Ag/ITO, ITO/Ag/IZO, ITO/Ag/ITZO/IZO, or the like. The electrodes RME may be electrically connected to the light emitting element ED and may reflect some of the light emitted from the light emitting element ED in an upward direction of the first substrate SUB.

A lower insulating layer RPAS may be disposed across the entire surface of the display area DPA and may be disposed on the via layer VIA and the plurality of electrodes RME. The lower insulating layer RPAS may be disposed under the light emitting element ED, which will be described later, to cover the electrodes RME. The lower insulating layer RPAS may include an insulating material to protect the plurality of electrodes RME and insulate the different electrodes RME from each other. The lower insulating layer RPAS is disposed to cover the electrodes RME before the bank layer BNL is formed so that the electrodes RME are not damaged in a process of forming the bank layer BNL. The lower insulating layer RPAS may prevent the light emitting element ED disposed thereon from being damaged by direct contact with other members.

In an embodiment, the lower insulating layer RPAS may have stepped portions such that the top surface thereof is partially depressed between the electrodes RME spaced apart in the second direction DR2. The light emitting element ED may be disposed on the top surface of the lower insulating layer RPAS at where the stepped portions are formed and, thus, a space may remain between the light emitting element ED and the lower insulating layer RPAS. A space between the light emitting element ED and the lower insulating layer RPAS may be filled with the first insulating layer PAS1, to be described later.

According to one embodiment, the lower insulating layer RPAS may have the contact portions CT1 and CT2. The contact portions CT1 and CT2 of the lower insulating layer RPAS may be formed at a portion where the connection electrode CNE is connected to the electrode RME in the sub-region SA. The lower insulating layer RPAS may be entirely disposed on the via layer VIA, and the portion at where the contact portions CT1 and CT2 are formed may expose a part of layers thereunder.

The contact portions CT1 and CT2 formed in the lower insulating layer RPAS may be disposed to overlap different electrodes RME. For example, the contact portions CT1 and CT2 may include first contact portions CT1 disposed to overlap the first electrode RME1 and second contact portions CT2 disposed in the sub-region SA to overlap the second electrode RME2 in the sub-region SA. The first contact portions CT1 and the second contact portions CT2 may penetrate the lower insulating layer RPAS to partially expose the top surface of the first electrode RME1 or the second electrode RME2 thereunder. Each of the first contact portion CT1 and the second contact portion CT2 may further penetrate some of the other insulating layers disposed on the lower insulating layer RPAS. The electrode RME exposed by each of the contact portions CT1 and CT2 may be in contact with the connection electrode CNE.

The bank layer BNL may be disposed on the lower insulating layer RPAS. The bank layer BNL may include portions extending in the first direction DR1 and the second direction DR2 and may surround the sub-pixels SPXn. The bank layer BNL may surround and distinguish the emission area EMA and the sub-region SA of each sub-pixel SPXn and may surround the outermost part of the display area DPA and distinguish the display area DPA and the non-display area NDA. The bank layer BNL is disposed in the entire display area DPA to form a grid pattern, and the regions exposed by the bank layer BNL in the display area DPA may be the emission area EMA and the sub-region SA.

Similar to the bank patterns BP1 and BP2, the bank layer BNL may have a height (e.g., a certain height). In some embodiments, the top surface of the bank layer BNL may be higher than (e.g., may extend above) that of the bank patterns BP1 and BP2, and the thickness of the bank layer BNL may be equal to or greater than that of the bank patterns BP1 and BP2. The bank layer BNL may prevent ink from overflowing into adjacent sub-pixels SPXn during an inkjet printing process during the manufacturing process of the display device 10. Similar to the bank patterns BP1 and BP2, the bank layer BNL may include an organic insulating material, such as polyimide.

According to one embodiment, in the display device 10, the bank layer BNL may include a have of trench portions P. The trench portions P may be disposed in a portion of the bank layer BNL extending in the first direction DR1 between the sub-pixels SPXn adjacent to each other in the second direction DR2. For example, the trench portions P may be disposed between the emission areas EMA of different sub-pixels SPXn arranged in the second direction DR2. The trench portion P may be disposed so as not to overlap (e.g., may be offset from) the bank patterns BP1 and BP2, the electrodes RME1 and RME2, and the light emitting element ED, to be described later, which are disposed in the emission area EMA. The trench portions P disposed between adjacent emission areas EMA may be spaced apart from each other in the first direction DR1, and the trench portions P disposed between other emission areas EMA may be spaced apart from each other in the second direction DR2. The trench portions P disposed between the emission area EMA of the first sub-pixel SPX1 and the emission area EMA of the second sub-pixel SPX2 may be spaced apart from each other in the first direction DR1, and the trench portions P disposed between the first sub-pixel SPX1 and the second sub-pixel SPX2 may be spaced apart in the second direction DR2 from the trench portions P disposed between the second sub-pixel SPX2 and the third sub-pixel SPX3.

The trench portions P may be formed on the top surface of the bank layer BNL. The trench portions P may be a portion formed by partially depressing the top surface of the bank layer BNL and may have a smaller thickness than that of the other part of the bank layer BNL. The trench portions P may have a height lower than that of a flat top surface of the bank layer BNL and may have a puddle-like shape. A detailed description of the trench portions P will be provided later with reference to other drawings.

The plurality of light emitting elements ED may be arranged in the emission area EMA. The light emitting elements ED may be disposed between the bank patterns BP1 and BP2, and may be arranged to be spaced apart from each other in the first direction DR1. In one embodiment, the plurality of light emitting elements ED may have a shape extending in one direction, and both ends thereof may be disposed on different electrodes RME. The length of the light emitting element ED may be greater than the gap between the electrodes RME spaced apart from each other in the second direction DR2. The extension direction of the light emitting elements ED may be substantially perpendicular to the first direction DR1 in which the electrodes RME extend. However, the present disclosure is not limited thereto, and the light emitting element ED may extend in the second direction DR2 or in a direction oblique to the second direction DR2.

The plurality of light emitting elements ED may be directly disposed on the lower insulating layer RPAS. The light emitting element ED may have a shape extending in one direction and may be disposed such that one direction in which the light emitting element ED extends is parallel to the top surface of the first substrate SUB. As will be described later, the light emitting element ED may include a plurality of semiconductor layers arranged along one direction in which the light emitting element ED extends, and the plurality of semiconductor layers may be sequentially arranged along the direction parallel to the top surface of the first substrate SUB. However, the present disclosure is not limited thereto, and the plurality of semiconductor layers may be arranged in the direction perpendicular to the first substrate SUB when the light emitting element ED has a different structure.

The light emitting elements ED disposed in each sub-pixel SPXn may emit light of different wavelength bands depending on a material constituting the semiconductor layer. However, the present disclosure is not limited thereto, and the light emitting elements ED arranged in each sub-pixel SPXn may include the semiconductor layer having (or formed of) the same material to emit light of the same color.

The light emitting elements ED may be electrically connected to the electrode RME and the conductive layers below the via layer VIA while being in contact with the connection electrodes CNE (e.g., CNE1 and CNE2) and may emit light of a specific wavelength band in response to an electrical signal.

The first insulating layer PAS1 may be disposed on the plurality of light emitting elements ED, the lower insulating layer RPAS, and the bank layer BNL. The first insulating layer PAS1 may include a pattern portion disposed on the plurality of light emitting elements ED while extending in the first direction DR1 between the bank patterns BP1 and BP2. The pattern portion is disposed to partially surround the outer surface of the light emitting element ED and may not cover both sides or both ends of the light emitting element ED. The pattern portion may form a linear or island-like pattern in each sub-pixel SPXn in a plan view. The pattern portion of the first insulating layer PAS1 may protect the light emitting element ED and fix the light emitting elements ED during a manufacturing process of the display device 10. Further, the first insulating layer PAS1 may be disposed to fill the space between the light emitting element ED and the lower insulating layer RPAS thereunder. Further, a part of the first insulating layer PAS1 may be disposed on the bank layer BNL and in the sub-regions SA.

According to one embodiment, the first insulating layer PAS1 may have a plurality of openings OP1, OP2, and OPR, opening holes OPH, and the contact portions CT1 and CT2. The first insulating layer PAS1 may have the plurality of separation openings OPR formed to correspond to the separation portion ROP of the sub-region SA, the plurality of openings OP1 and OP2 disposed to partially overlap the electrode RME to expose the first ends and the second ends of the light emitting elements ED in the emission area EMA, the opening holes OPH disposed on the bank layer BNL. Further, the first insulating layer PAS1 may include the plurality of contact portions CT1 and CT2 formed at the portions in which the connection electrode CNE and the electrode RME are connected. The first insulating layer PAS1 may be disposed entirely on the lower insulating layer RPAS and the bank layer BNL and may partially expose the layers disposed thereunder at the portions in which the plurality of openings are formed.

At the separation openings OPR formed to correspond to the separation portions ROP of the sub-regions SA, which are the openings formed in the first insulating layer PAS1, the process of separating the electrodes RME disposed thereunder may be performed. The lower insulating layer RPAS and the first insulating layer PAS1 may include the separation opening OPR exposing the top surface of the via layer VIA at the separation portion ROP in which the process of separating the electrodes RME is performed.

The first insulating layer PAS1 may have first openings OP1 partially overlapping the first electrode RME1 and second openings OP2 partially overlapping the second electrode RME2. The first openings OP1 and the second openings OP2 may be disposed in the emission area EMA and may expose both ends of the light emitting elements ED. The first openings OP1 may expose (or may not cover) the first ends of the light emitting elements ED that are disposed on the first electrode RME1, and the second openings OP2 may expose (or may not) cover the second ends of the light emitting elements ED that are disposed on the second electrode RME2.

The plurality of first openings OP1 may be disposed to overlap one side of the first electrode RME1 that faces the second electrode RME2 and may have a shape extending in the first direction DR1. The first opening OP1 may expose the first ends of the light emitting elements ED.

Similarly, the second openings OP2 may be disposed to overlap one side of the second electrode RME2 that faces the first electrode RME1 and may have a shape extending in the first direction DR1. The second opening OP2 may expose the second ends of the light emitting elements ED. The second openings OP2 may also penetrate a second insulating layer PAS2, to be described later. The connection electrodes CNE may be in contact with both ends of the light emitting elements ED exposed through the plurality of first openings OP1 and the plurality of second openings OP2.

One first opening OP1 and one second opening OP2 may be disposed in one sub-pixel SPXn. However, the present disclosure is not limited thereto. In some embodiments, the plurality of first openings OP1 and the plurality of second openings OP2 may be disposed in one sub-pixel SPXn.

According to one embodiment, the first insulating layer PAS1 may include the plurality of opening holes OPH disposed on the bank layer BNL. Different from the openings OP1 and OP2 that partially overlap the electrodes RME, the opening holes OPH may be disposed so as not to overlap the electrodes RME. As an example, the plurality of opening holes OPH may be spaced apart from each other in the first direction DR1 and may be disposed on a portion of the bank layer BNL extending in the first direction DR1. Similar to the trench portion P in the bank layer BNL, the opening hole OPH may be disposed between the emission areas EMA of different sub-pixels SPXn. The opening hole OPH may be disposed to expose a part of the top surface of the bank layer BNL, and the second insulating layer PAS2, to be described later, may be directly disposed on the exposed top surface of the bank layer BNL.

The opening holes OPH may be disposed between the emission areas EMA of different sub-pixels SPXn arranged in the second direction DR2. The opening holes OPH disposed between adjacent emission areas EMA may be spaced apart from each other in the first direction DR1, and the opening holes OPH disposed between different emission areas EMA may be spaced apart from each other in the second direction DR2. For example, the opening holes OPH disposed between the emission area EMA of the first sub-pixel SPX1 and the emission area EMA of the second sub-pixel SPX2 may be spaced apart from each other in the first direction DR1, and the opening holes OPH disposed between the first sub-pixel SPX1 and the second sub-pixel SPX2 may be spaced apart in the second direction DR2 from the opening holes disposed between the second sub-pixel SPX2 and the third sub-pixel SPX3.

The first opening OP1 and the second opening OP2 may be disposed in the emission area EMA to expose a part of the light emitting element ED so that the connection electrodes CNE disposed on the first insulating layer PAS1 can be in contact with the light emitting element ED. Similar to the trench portion P, the opening hole OPH may be formed at where the light emitting elements ED are not disposed. The opening hole OPH may be disposed so as not to overlap (e.g., to be offset from) the light emitting elements ED and the electrodes RME.

Different from the trench portion P having a shape formed by partially depressing the top surface of the bank layer BNL, the opening holes OPH may penetrate (e.g., may extend through) the first insulating layer PAS1. The opening hole OPH may expose a part of the top surface of the bank layer BNL and may expose a flat top surface of the bank layer BNL or the trench portion P according to an arrangement relationship with the trench portion P. Because the opening hole OPH is formed to penetrate the first insulating layer PAS1, it may provide a discharge path of gases that may be generated in the bank layer BNL and layers thereunder during the manufacturing process of the display device 10. A detailed description of the opening hole OPH will be described later with reference to other drawings.

The first insulating layer PAS1 may have the first contact portions CT1 disposed to overlap the first electrode RME1, and the second contact portions CT2 disposed to overlap the second electrode RME2, which are disposed in the sub-region SA. The contact portions CT1 and CT2 may penetrate the first insulating layer PAS1 in addition to the lower insulating layer RPAS. The plurality of first contact portions CT1 and the plurality of second contact portions CT2 may partially expose the top surface of the first electrode RME1 or the second electrode RME2 disposed thereunder.

The plurality of connection electrodes CNE (e.g., CNE1 and CNE2) may be disposed on the plurality of electrodes RME and the bank patterns BP1 and BP2. The plurality of connection electrodes CNE may have a shape extending in one direction and may be disposed to be spaced apart from each other. Each of the connection electrodes CNE may be in contact with the light emitting element ED and may be electrically connected to the third conductive layer.

The plurality of connection electrodes CNE may include the first connection electrode CNE1 and the second connection electrode CNE2 disposed in each sub-pixel SPXn. The first connection electrode CNE1 may have a shape extending in the first direction DR1 and may be disposed on the first electrode RME1 or the first bank pattern BP1. The first connection electrode CNE1 may partially overlap the first electrode RME1 and may be disposed across the emission area EMA and the sub-region SA over the bank layer BNL. The second connection electrode CNE2 may have a shape extending in the first direction DR1 and may be disposed on the second electrode RME2 or the second bank pattern BP2. The second connection electrode CNE2 may partially overlap the second electrode RME2 and may be disposed across the emission area EMA and the sub-region SA over the bank layer BNL. Each of the first connection electrode CNE1 and the second connection electrode CNE2 may be in contact with the light emitting elements ED and may be electrically connected to the electrodes RME or the conductive layer disposed thereunder.

For example, each of the first connection electrode CNE1 and the second connection electrode CNE2 may be disposed on the first insulating layer PAS1 and may be in contact with the light emitting elements ED. The first connection electrode CNE1 may partially overlap the first electrode RME1 and may be in contact with one ends of the light emitting elements ED. The second connection electrode CNE2 may partially overlap the second electrode RME2 and may be in contact with the other ends of the light emitting elements ED. The plurality of connection electrodes CNE are disposed across the emission area EMA and the sub-region SA. The connection electrodes CNE may be in contact with the light emitting elements ED at portions disposed in the emission area EMA and may be electrically connected to the third conductive layer at portions disposed in the sub-region SA.

The first connection electrode CNE1 may be disposed to partially overlap the first opening OP1 in the first insulating layer PAS1. The second connection electrode CNE2 may be disposed to partially overlap the second opening OP2 in the first insulating layer PAS1. The first connection electrode CNE1 may be in contact with the first ends of the light emitting elements ED exposed through the first opening OP1, and the second connection electrode CNE2 may be in contact with the second ends of the light emitting elements ED exposed through the second opening OP2.

In accordance with one embodiment, in the display device 10, the connection electrodes CNE may be in contact with the electrode RME through the contact portions CT1 and CT2 disposed in the sub-region SA. The first connection electrode CNE1 may be in contract with the first electrode RME1 through the first contact portion CT1 penetrating the lower insulating layer RPAS, the first insulating layer PAS1, and the second insulating layer PAS2 in the sub-region SA. The second connection electrode CNE2 may be in contact with the second electrode RME2 through the second contact portion CT2 penetrating the lower insulating layer RPAS and the first insulating layer PAS1 in the sub-region SA. Each of the connection electrodes CNE may be electrically connected to the third conductive layer through each of electrodes RME. The first connection electrode CNE1 may be electrically connected to the first transistor T1 so that the first power voltage may be applied to the first connection electrode CNE1, and the second connection electrode CNE2 may be electrically connected to the second voltage line VL2 so that the second power voltage may be applied to the second connection electrode CNE2. Each connection electrode CNE may be in contact the light emitting element ED in the emission area EMA to transmit the power voltage to the light emitting element ED.

However, the present disclosure is not limited thereto. In some embodiments, the plurality of connection electrodes CNE may be in direct contact with the third conductive layer and may be electrically connected to the third conductive layer through patterns other than the electrodes RME.

The connection electrodes CNE may include a conductive material. For example, they may include ITO, IZO, ITZO, aluminum (Al), or the like. As an example, the connection electrodes CNE may include a transparent conductive material, and light emitted from the light emitting element ED may pass through the connection electrodes CNE to be emitted.

The second insulating layer PAS2 is disposed on the second connection electrode CNE2 and the first insulating layer PAS1 of the first connection electrode layer. The second insulating layer PAS2 may be disposed on the entire first insulating layer PAS1 to cover the second connection electrode CNE2, and the first connection electrode CNE1 of the second connection electrode layer may be disposed on the second insulating layer PAS2. The second insulating layer PAS2 may insulate the first connection electrode CNE1 and the second connection electrode CNE2 to prevent direct contact therebetween.

According to one embodiment, the second insulating layer PAS2 may have the first openings OP1 and the first contact portions CT1. The second insulating layer PAS2 may include the plurality of first openings OP1 disposed to partially overlap the electrode RME to expose the first ends of the light emitting elements ED and the plurality of first contact portions CT1 formed in a region where the first connection electrode CNE1 and the first electrode RME1 are connected. The first opening OP1 may penetrate the first insulating layer PAS1 and the second insulating layer PAS2. The second insulating layer PAS2 may be disposed on the entire first insulating layer PAS1 and may partially expose the layers disposed thereunder at the portions in which the plurality of first openings OP1 are formed. The first connection electrode CNE1 may be disposed to partially overlap the first opening OP1 of the second insulating layer PAS2.

The first openings OP1 of the second insulating layer PAS2 may partially overlap the first electrode RME1 in the emission area EMA and may expose or may not cover the first ends of the light emitting elements ED that are disposed on the first electrode RME1. The first openings OP1 may be disposed to overlap one side of the first electrode RME1 that faces the second electrode RME2 and may have a shape extending in the first direction DR1.

The second insulating layer PAS2 may be disposed on the second opening OP2 and the opening hole OPH in the first insulating layer PAS1. Because the second connection electrode CNE2 is disposed in the second opening OP2 in the first insulating layer PAS1, the second insulating layer PAS2 may be disposed to cover the second connection electrode CNE2. The top surface of the bank layer BNL may be partially exposed through the opening hole OPH in the first insulating layer PAS1, and the second insulating layer PAS2 may be in direct contact with a part of the top surface of the bank layer BNL. Depending on the arrangement of the trench portions P in the bank layer BNL and the opening hole OPH in the first insulating layer PAS1, the second insulating layer PAS2 may cover the trench portions P or may directly cover the flat surface of the bank layer BNL. In other embodiments, the second insulating layer PAS2 may be disposed on the first insulating layer PAS1 while overlapping the trench portion P.

The second insulating layer PAS2 may include the first contact portions CT1 disposed in the sub-region SA to overlap the first electrode RME1. The plurality of first contact portions CT1 may penetrate the second insulating layer PAS2 in addition to the lower insulating layer RPAS and the first insulating layer PAS1. The plurality of first contact portions CT1 may partially expose the top surface of the first electrode RME1 disposed thereunder.

In some embodiments, another insulating layer may be disposed on the second insulating layer PAS2 and the first connection electrode CNE1. The insulating layer may protect the members disposed on the first substrate SUB against the external environment.

Each of the lower insulating layer RPAS, the first insulating layer PAS1, and the second insulating layer PAS2 described above may include an inorganic insulating material or an organic insulating material. For example, each of the lower insulating layer RPAS, the first insulating layer PAS1, and the second insulating layer PAS2 may include an inorganic insulating material. In other embodiments, the lower insulating layer RPAS and the second insulating layer PAS2 may include an inorganic insulating material, and the first insulating layer PAS1 may include an organic insulating material. Each or at least one of the lower insulating layer RPAS, the first insulating layer PAS1, and the second insulating layer PAS2 may have a structure in which a plurality of insulating layers are stacked alternately or repeatedly. In an embodiment, each of the lower insulating layer RPAS, the first insulating layer PAS1, and the second insulating layer PAS2 may be any one of silicon oxide ($SiO_x$), silicon nitride ($SiN_x$), and silicon oxynitride ($SiO_xN_y$). The lower insulating layer RPAS, the first insulating layer PAS1, and the second insulating layer PAS2 may be made of the same material or of different materials. In other embodiments, some of them may be made of the same material and some of them may be made of different materials.

Each pixel PX or sub-pixel SPXn (wherein n is an integer of 1 to 3) of the display device 10 includes a pixel driving circuit. The above-described wires may pass through each pixel PX or the periphery thereof to apply a driving signal to each pixel driving circuit. The pixel driving circuit may include transistors and capacitors. The number of transistors and capacitors of each pixel driving circuit may vary. According to one embodiment, in each sub-pixel SPXn of the display device 10, the pixel driving circuit may have a 3T1C structure including three transistors and one capacitor. Hereinafter, a pixel driving circuit having the 3T1C structure will be described as an example, but the present disclosure is not limited thereto, and various other modified structures, such as a 2T1C structure, a 7T1C structure, and a 6T1C structure, may be applied.

Figure 7:
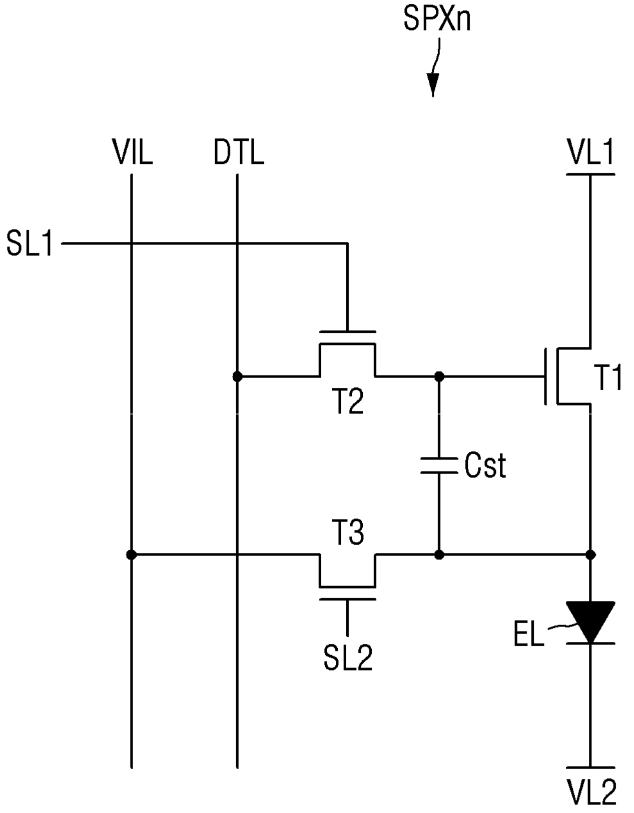
FIG. 7 is an equivalent circuit diagram of a sub-pixel according to one embodiment.

FIG. 7 is an equivalent circuit diagram of a sub-pixel according to one embodiment.

Referring to FIG. 7, each sub-pixel SPXn of the display device 10 according to one embodiment includes three transistors T1, T2 and T3 and one storage capacitor Cst in addition to a light emitting diode EL.

The light emitting diode EL emits light by (or according to) a current supplied through a first transistor T1. The light emitting diode EL includes at least one light emitting element ED. The light emitting element ED may emit light in a specific wavelength band by an electrical signal transmitted from the first electrode RME1 and the second electrode RME2.

One end of the light emitting diode EL may be connected to the source electrode of the first transistor T1, and the other end thereof may be connected to the second voltage line VL2 to which a low potential voltage (hereinafter, a second power voltage) lower than a high potential voltage (hereinafter, a first power voltage) of the first voltage line VL1 is supplied.

The first transistor T1 adjusts a current flowing from the first voltage line VL1, to which the first power voltage is supplied, to the light emitting diode EL according to the voltage difference between the gate electrode and the source electrode. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage line VL1 to which the first power voltage is applied.

The second transistor T2 is turned on by a scan signal of a first scan line SL1 to connect the data line DTL to the gate electrode of the first transistor T1. The gate electrode of the second transistor T2 may be connected to the first scan line SL1, the source electrode thereof may be connected to the gate electrode of the first transistor T1, and the drain electrode thereof may be connected to the data line DTL.

The third transistor T3 is turned on by a scan signal of the second scan line SL2 to connect the initialization voltage line VIL to one end of the light emitting diode EL. The gate electrode of the third transistor T3 may be connected to the second scan line SL2, the drain electrode thereof may be connected to the initialization voltage line VIL, and the source electrode thereof may be connected to one end of the light emitting diode EL or to the source electrode of the first transistor T1.

The gate electrodes of the second transistor T2 and the third transistor T3 are illustrated as being electrically connected to different scan lines SL1 and SL2, respectively, but the present disclosure is not limited thereto. In some embodiments, the gate electrodes of the second transistor T2 and the third transistor T3 may be electrically connected to the same scan line.

The source electrode and the drain electrode of each of the transistors T1, T2, and T3 are not limited to those described above, and vice versa. Further, each of the transistors T1, T2, and T3 may be formed of a thin film transistor. In addition, in FIG. 7, each of the transistors T1, T2, and T3 has been described as being formed of an N-type metal oxide semiconductor field effect transistor (MOSFET), but they are not limited thereto. For example, each of the transistors T1, T2, and T3 may be formed of a P-type MOSFET. In other embodiments, some of the transistors T1, T2, and T3 may be formed of an N-type MOSFET and the others may be formed of a P-type MOSFET.

The storage capacitor Cst is formed between (e.g., is electrically connected between) the gate electrode and the source electrode of the first transistor T1. The storage capacitor Cst stores a voltage difference between a gate voltage and a source voltage of the first transistor T1.

Figure 8:
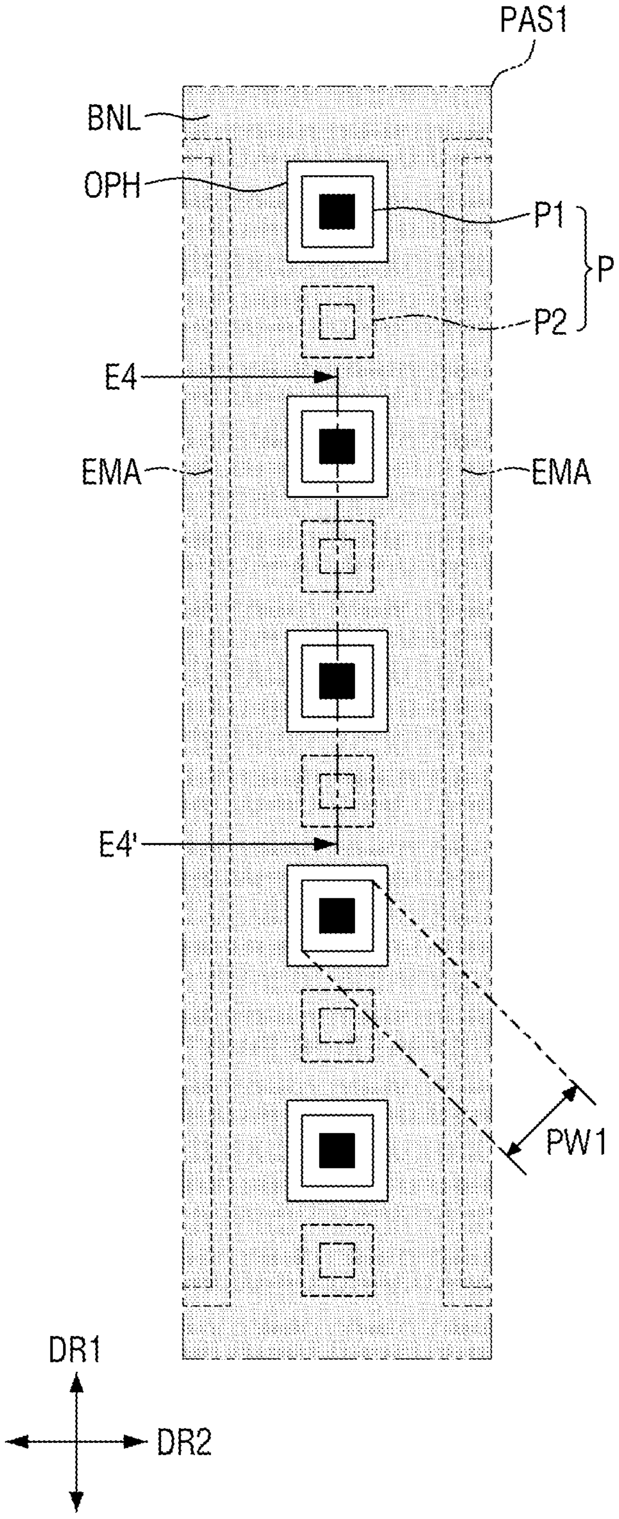
FIG. 8 is a plan view illustrating a trench portion formed in a bank layer and an opening (e.g., an opening hole) formed in a first insulating layer in a display device according to one embodiment.
Figure 9:
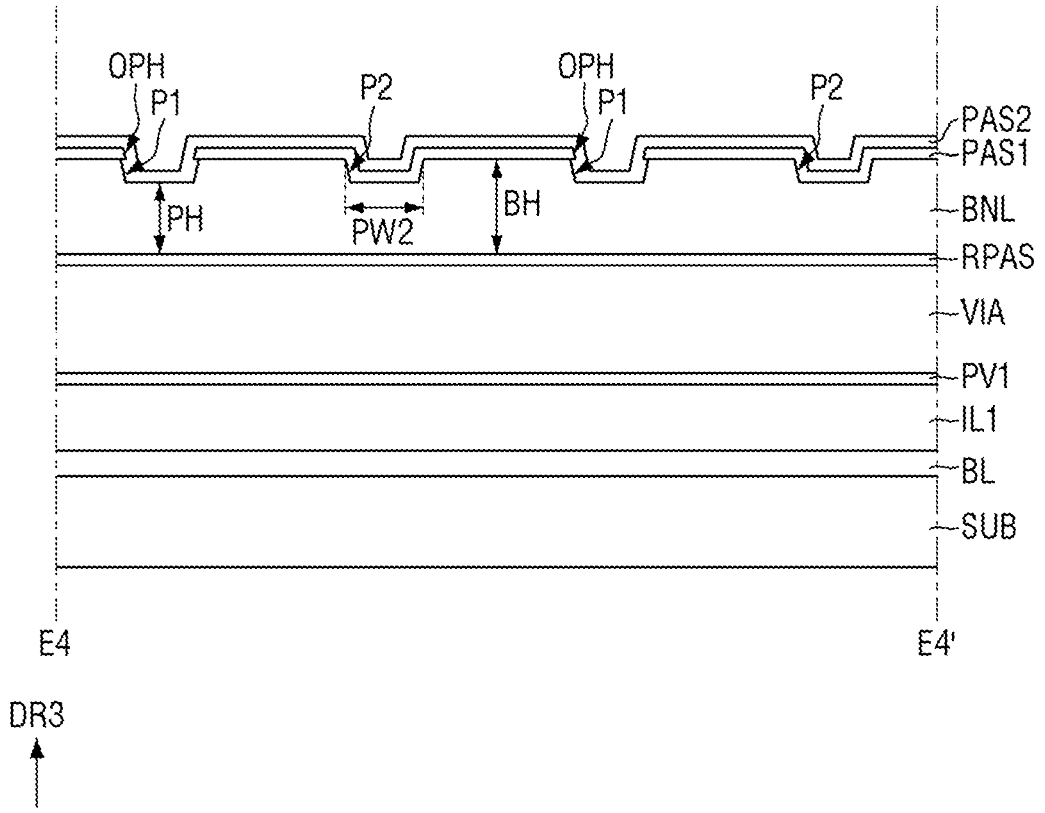
FIG. 9 is a cross-sectional view taken along the line E4-E4' of FIG. 8.

FIG. 8 is a plan view illustrating an arrangement of a trench portion formed in a bank layer and an opening hole formed in a first insulating layer in a display device according to one embodiment. FIG. 9 is a cross-sectional view taken along the line E4-E4' of FIG. 8.

FIG. 8 is an enlarged view of an area in which the trench portions P in the bank layer BNL and the opening holes OPH in the first insulating layer PAS1 are disposed. FIG. 9 illustrates a cross section of the trench portions P and the opening holes OPH taken along the first direction DR1.

Referring to FIGS. 8 and 9, the trench portions P in the bank layer BNL may be formed on a portion of the bank layer BNL extending in the first direction DR1. The trench portions P may be disposed between the emission areas EMA adjacent in the second direction DR2 and may not be disposed between the sub-regions SA adjacent in the second direction DR2. As will be described later, the trench portion P may contribute to an increase in the volume of ink in the manufacturing process of the display device 10. Accordingly, the position of the trench portion P is an area to which the ink is to be sprayed and may be located adjacent to the emission area EMA. The trench portion P may have a rectangular shape including sides extending in the first direction DR1 and the second direction DR2, but it is not limited thereto. The shape of the trench portion P may be variously modified in a plan view.

The opening hole OPH in the first insulating layer PAS1 may also be disposed on a portion of the bank layer BNL extending in the first direction DR1. The opening holes OPH may be disposed between the emission areas EMA adjacent in the second direction DR2 but may not be disposed between the sub-regions SA adjacent in the second direction DR2. The opening hole OPH in the first insulating layer PAS1 may be a discharge path for gases generated from organic layers, such as the bank layer BNL and the via layer VIA, disposed thereunder during the manufacturing process. Accordingly, the opening holes OPH may be disposed on (or formed over) the bank layer BNL other than (or outside of) the emission area EMA.

According to one embodiment, the plurality of trench portions P in the bank layer BNL may be divided into different trench portions P1 and P2 according to the arrangement of the opening holes OPH in the first insulating layer PAS1. For example, the trench portion P may include a first trench portion P1 that overlaps the opening hole OPH and a second trench portion P2 that does not overlap the opening hole OPH. Because the first trench portion P1 overlaps the opening hole OPH, the first insulating layer PAS1 is not disposed inside the first trench portion P1 and the second insulating layer PAS2 may be directly disposed inside the first trench portion P1. Because the second trench portion P2 does not overlap the opening hole OPH, the first insulating layer PAS1 may be directly disposed therein. In an embodiment in which the trench portions P and the opening holes OPH are arranged to be regularly spaced apart from each other in the first direction DR1, a distance between the trench portions P spaced apart in the first direction DR1 may be smaller than a distance between the opening holes OPH spaced apart in the first direction DR1. One or more second trench portions P2 may be disposed between the opening holes OPH spaced apart in the first direction DR1.

The present disclosure is, however, not limited thereto. The arrangement of the trench portions P and the arrangement of the opening hole OPH may not be limited to a special relationship with each other. In another embodiment, the opening hole OPH may be disposed so as not to overlap (e.g., to be offset from) the trench portion P or may overlap only a part of the trench portion P. The overlapping relationship between the trench portions P and the opening holes OPH may vary depending on the configuration of a mask pattern used in a process of forming each layer.

The light emitting elements ED may be disposed in the emission area EMA of each sub-pixel SPXn. During the manufacturing process of the display device 10, the light emitting elements ED, while in a state of being dispersed in the ink, may be sprayed onto the emission area EMA to be aligned on the electrodes RME. When the ink including the light emitting elements ED is sprayed onto the emission area EMA, the light emitting elements ED may be aligned on the electrode, and then, a process of drying the ink may be performed to arrange the light emitting elements ED.

In a process of spraying the light emitting elements ED onto the emission area EMA, the number of the sprayed (or deposited) light emitting elements ED may be related to the concentration of the light emitting elements ED in the ink and the volume of the sprayed ink. The number of processes for spraying the light emitting elements ED to provide the desired number of the light emitting elements ED per emission area EMA may vary depending on the concentration of the light emitting elements ED in the ink and the volume of the sprayed ink. As an example, as the volume of the ink sprayed onto the emission area EMA increases, the desired number of light emitting elements ED may be deposited without repeating the ink spraying process and the ink drying process, and thus, the process time may be shortened.

The display device 10 may include the plurality of trench portions P formed in the top surface of the bank layer BNL so that the volume of the ink sprayed onto the emission area EMA is increased. The ink spraying process (in which the ink includes the light emitting element ED) may be performed after the lower insulating layer RPAS and the bank layer BNL are formed. The ink sprayed onto the emission area EMA may fill an area surrounded by (e.g., bounded by) the bank layer BNL, and the edge of an interface where inks are seated, which refers to a pinning point of the ink, may be located on the top surface of the bank layer BNL. When the trench portion P is formed in the top surface of the bank layer BNL, the pinning point of the ink may be located within the trench portion P, and thus, the volume of the ink may be increased. Due to the trench portion P in the display device 10, the ink spraying and drying process may be shortened in a process of arranging the light emitting elements ED. The trench portion P may be spaced apart as far as possible from the emission area EMA to further increase the volume of the ink. For example, the trench portions P may be arranged at the center of a portion of the bank layer BNL extending in the first direction DR1.

Because the pinning point of the ink may be located in the trench portion P, some of the light emitting elements ED in the ink may enter the trench portion P. However, in the display device 10, because the trench portion P has a size that is too small for the light emitting elements ED to be disposed therein, the light emitting elements ED may not be lost in the trench portion P.

According to one embodiment a maximum width PW1 measured in one direction or a width PW2 of the major axis of the trench portion P may be smaller than the length of the light emitting element ED. As shown in FIGS. 8 and 9, in an embodiment in which the trench portion P has a rectangular shape, the maximum width PW1 of the trench portion P may be a width of the trench portion P measured in a diagonal direction (e.g., from one corner to an opposite corner), and the width PW1 may be smaller than the length of the light emitting element ED. In some embodiments, the width PW2 of the major axis of the trench portion P may be smaller than the length of the light emitting element ED depending on the shape of the trench portion P. In one embodiment, the light emitting element ED may have a length in a range of about 4 μm to about 10 μm (e.g., about 5 μm), and the maximum width PW1 of the trench portion P measured in one direction (e.g., in any direction) or the major axis width PW2 thereof may be in a range of less than about 4 μm or less than about 5 μm depending on the length of the light emitting element ED. The maximum width PW1 and the major axis width PW2 of the trench portion P may vary depending on the length of the light emitting element ED. As long as the trench portion P has a width (or size) such that some of the light emitting elements ED do not enter the trench portion P in the alignment process of the light emitting elements ED, the range thereof is not limited. However, the maximum width PW1 and the major axis width PW2 of the trench portion P may be smaller than the width of the portion of the bank layer BNL extending in the first direction DR1. This is a range in which the trench portion P can be formed on the bank layer BNL between the emission areas EMA. Although the display device 10 includes the trench portion P formed in the bank layer BNL, the light emitting element ED may be not be disposed in an area other than the emission area EMA and, thus, does not remain as a foreign matter.

The trench portion P in the bank layer BNL may have a shape formed by partially depressing the top surface of the bank layer BNL. Accordingly, in the bank layer BNL, a portion in which the trench portion P is formed and a portion in which the trench portion P is not formed may have different thicknesses. For example, a thickness PH of a first portion of the bank layer BNL in which the trench portion P is formed may be smaller than a thickness BH of a second portion of the bank layer BNL other than (e.g., offset from) the first portion. However, because the portion in which the trench portion P is formed has a minimum thickness such that an electric field caused by wires disposed under the bank layer BNL may be shielded. An electrical signal applied to the electrode RME in the alignment process of the light emitting elements ED may be transmitted through the conductive layers under the via layer VIA. A relatively weak electric field may be formed on the bank layer BNL by wires of the conductive layers disposed under the bank layer BNL. To prevent the light emitting elements ED from being misaligned by such an unintentional (or undesired) electric field, the bank layer BNL may have a thickness sufficient to shield the electric field. As an example, in the bank layer BNL, the thickness BH of the portion where the trench portion P is not formed may be equal to or greater than about 2 μm or about 3 μm, and the thickness PH of the portion where the trench portion P is formed may be equal to or greater than about 1.5 μm. The top surface of the bank layer BNL may be partially depressed so that the thickness PH of the portion at where the trench portion P is formed may be at least about 1.5 μm in consideration of the maximum thickness BH.

Figure 10:
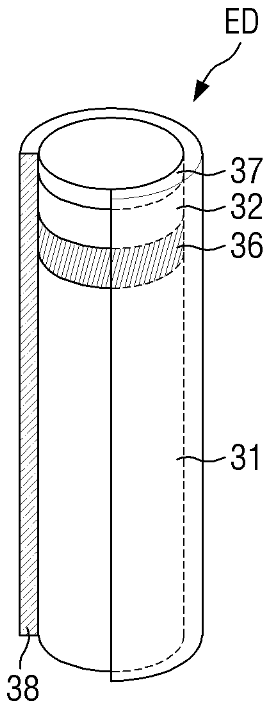
FIG. 10 is a schematic diagram of a light emitting element according to one embodiment.

FIG. 10 is a schematic diagram of a light emitting element according to one embodiment.

Referring to FIG. 10, the light emitting element ED may be a light emitting diode. For example, the light emitting element ED may be an inorganic light emitting diode that has a nanometer or micrometer size and is made of an inorganic material. The light emitting element ED may be aligned between two electrodes having polarity when an electric field is formed in a specific direction between that two electrodes that face each other.

The light emitting element ED according to one embodiment may have a shape elongated in one direction. The light emitting element ED may have a shape of a cylinder, a rod, a wire, a tube, or the like. However, the shape of the light emitting element ED is not limited thereto, and the light emitting element ED may have a polygonal prism shape, such as a regular cube, a rectangular parallelepiped, and a hexagonal prism, or may have various shapes, such as a shape elongated in one direction and having an outer surface partially inclined.

The light emitting element ED may include a semiconductor layer doped with any conductivity type (e.g., p-type or n-type) dopant. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ (0≤x≤1, 0≤y≤1, 0≤x+y≤1). For example, the first semiconductor layer 31 may be any one or more of AlGaInN, GaN, AlGaN, InGaN, AlN and InN doped with an n-type dopant. The n-type dopant doped into the first semiconductor layer 31 may be Si, Ge, Sn, or the like.

The second semiconductor layer 32 is disposed on the first semiconductor layer 31 with the light emitting layer 36 therebetween. The second semiconductor layer 32 may be a p-type semiconductor, and the second semiconductor layer 32 may include a semiconductor material having a chemical formula of $Al_xGa_yIn_{1-x-y}N$ (0x≤1, 0≤y≤1, 0≤x+y≤1). For example, the second semiconductor layer 32 may be any one or more of AlGaInN, GaN, AlGaN, InGaN, AlN and InN doped with a p-type dopant. The p-type dopant doped into the second semiconductor layer 32 may be Mg, Zn, Ca, Ba, or the like.

Although the first semiconductor layer 31 and the second semiconductor layer 32 are illustrated as being one layer, the present disclosure is not limited thereto. Depending on the material of the light emitting layer 36, the first semiconductor layer 31 and the second semiconductor layer 32 may include a greater number of layers, such as a cladding layer or a tensile strain barrier reducing (TSBR) layer. For example, the light emitting element ED may include another semiconductor layer disposed between the first semiconductor layer 31 and the light emitting layer 36 or between the second semiconductor layer 32 and the light emitting layer 36. A semiconductor layer disposed between the first semiconductor layer 31 and the light emitting layer 36 may be any one or more of AlGaInN, GaN, AlGaN, InGaN, AlN, InN and SLs doped with an n-type dopant, and a semiconductor layer disposed between the second semiconductor layer 32 and the light emitting layer 36 may be any one or more of AlGaInN, GaN, AlGaN, InGaN, AlN, and InN doped with a p-type dopant.

The light emitting layer 36 is disposed between the first semiconductor layer 31 and the second semiconductor layer 32. The light emitting layer 36 may include a material having a single or multiple quantum well structure. When the light emitting layer 36 includes a material having a multiple quantum well structure, a plurality of quantum layers and well layers may be alternately stacked. The light emitting layer 36 may emit light by the coupling of electron-hole pairs according to an electrical signal applied through the first semiconductor layer 31 and the second semiconductor layer 32. The light emitting layer 36 may include a material, such as AlGaN, AlGaInN, or InGaN. For example, when the light emitting layer 36 has a multiple quantum well structure in which quantum layers and well layers are alternately stacked, the quantum layer may include a material, such as AlGaN or AlGaInN, and the well layer may include a material, such as GaN or AlInN.

The light emitting layer 36 may have a structure in which semiconductor materials having large band gap energy and semiconductor materials having small band gap energy are alternately stacked and may include other group III to V semiconductor materials according to the wavelength band of the light to be emitted. The light emitted by the light emitting layer 36 is not limited to the light of the blue wavelength band, but the light emitting layer 36 may also emit light of a red or green wavelength band in some embodiments.

The electrode layer 37 may be an ohmic connection electrode. However, the present disclosure is not limited thereto, and it may be a Schottky connection electrode in other embodiments. The light emitting element ED may include at least one electrode layer 37. The light emitting element ED may include one or more electrode layers 37, but the present disclosure is not limited thereto, and the electrode layer 37 may be omitted.

In the display device 10, when the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating film 38 is arranged to surround the outer surfaces of the plurality of the semiconductor layers and electrode layers described above. For example, the insulating film 38 may be disposed to surround at least the outer surface of the light emitting layer 36 and may be formed to expose both ends of the light emitting element ED in the longitudinal direction. Further, in cross-sectional view, the insulating film 38 may have a top surface, which is rounded in a region adjacent to at least one end of the light emitting element ED.

The insulating film 38 may include at least one material having insulating properties, for example, silicon oxide ($SiO_x$), silicon nitride ($SiN_x$), silicon oxynitride ($SiO_xN_y$), aluminum nitride ($ALN_x$), aluminum oxide ($AlO_x$), zirconium oxide ($ZrO_x$), hafnium oxide ($HfO_x$), or titanium oxide ($TiO_x$). Although the insulating film 38 is illustrated as being a single layer, but the present disclosure is not limited thereto. In some embodiments, the insulating film 38 may be formed in a multilayer structure having a plurality of layers stacked therein.

The insulating film 38 may protect the semiconductor layers and the electrode layer of the light emitting element ED. The insulating film 38 may prevent an electrical short circuit that is likely to occur at the light emitting layer 36 when an electrode to which an electrical signal is transmitted is in direct contact with the light emitting element ED. In addition, the insulating film 38 may prevent a decrease in luminous efficiency of the light emitting element ED.

Further, the insulating film 38 may have an outer surface which is surface-treated. The light emitting elements ED may be aligned in such a way of spraying the ink in which the light emitting elements ED are dispersed on the electrodes. For example, the surface of the insulating film 38 may be treated to have a hydrophobic property or hydrophilic property to keep the light emitting elements ED in the dispersed state without aggregating with other adjacent light emitting elements ED in the ink.

Hereinafter, other embodiments of the display device 10 will be described with reference to other drawings.

Figure 11:
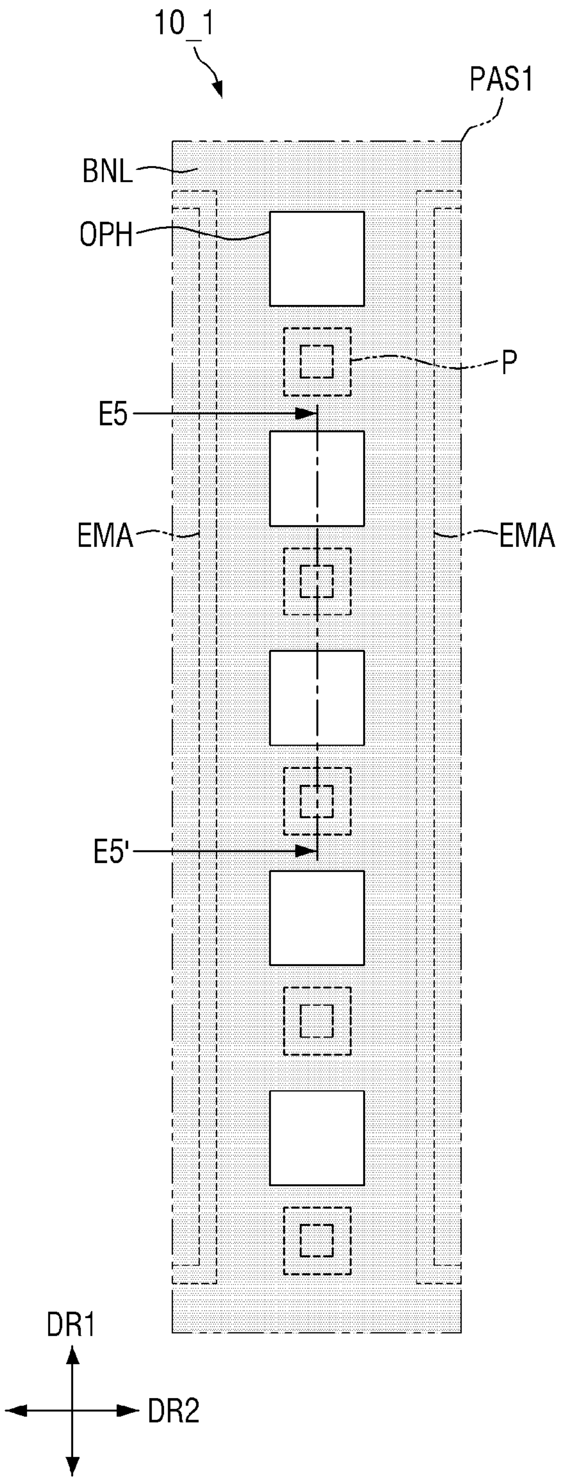
FIG. 11 is a plan view illustrating a trench portion formed in a bank layer and an opening hole formed in a first insulating layer in a display device according to another embodiment.
Figure 12:
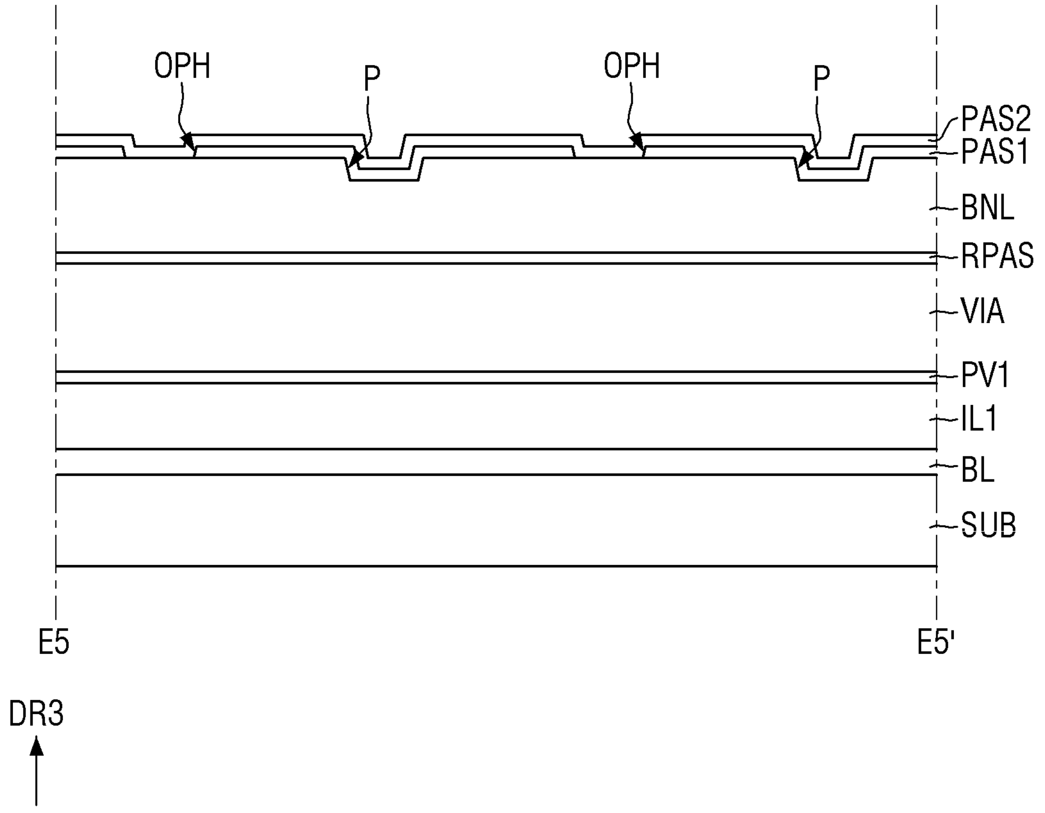
FIG. 12 is a cross-sectional view taken along the line E5-E5' of FIG. 11.

FIG. 11 is a plan view illustrating the arrangement of a trench portion formed in a bank layer and an opening hole formed in a first insulating layer in a display device according to another embodiment. FIG. 12 is a cross-sectional view taken along the line E5-E5' of FIG. 11. FIG. 12 illustrates a cross section traversing the trench portions P in the bank layer BNL and the opening holes OPH in the first direction DR1.

Referring to FIGS. 11 and 12, in a display device 10_1 according to one embodiment, the trench portion P in the bank layer BNL and the opening hole OPH in the first insulating layer PAS1 may be disposed not to overlap each other. The trench portions P and the opening holes OPH may each be disposed in a portion of the bank layer BNL extending in the first direction DR1 and may be alternately disposed so as not to overlap each other in the thickness direction. In a plan view, the opening holes OPH may be positioned between the trench portions P spaced apart in the first direction DR1, and the trench portions P may be positioned between the opening holes OPH spaced apart in the first direction DR1. As described above, the arrangement of the trench portions P in the bank layer BNL and the opening holes OPH in the first insulating layer PAS1 may not be particularly limited.

In the display device 10_1, because the trench portions P and the opening holes OPH are disposed so as not to overlap each other, the second insulating layer PAS2 may be in direct contact with the first insulating layer PAS1 that covers the trench portion P and the flat top surface of the bank layer BNL. The trench portion P may be covered by the first insulating layer PAS1, and a portion of the bank layer BNL that overlaps the opening hole OPH may be in direct contact with the second insulating layer PAS2.

Figure 13:
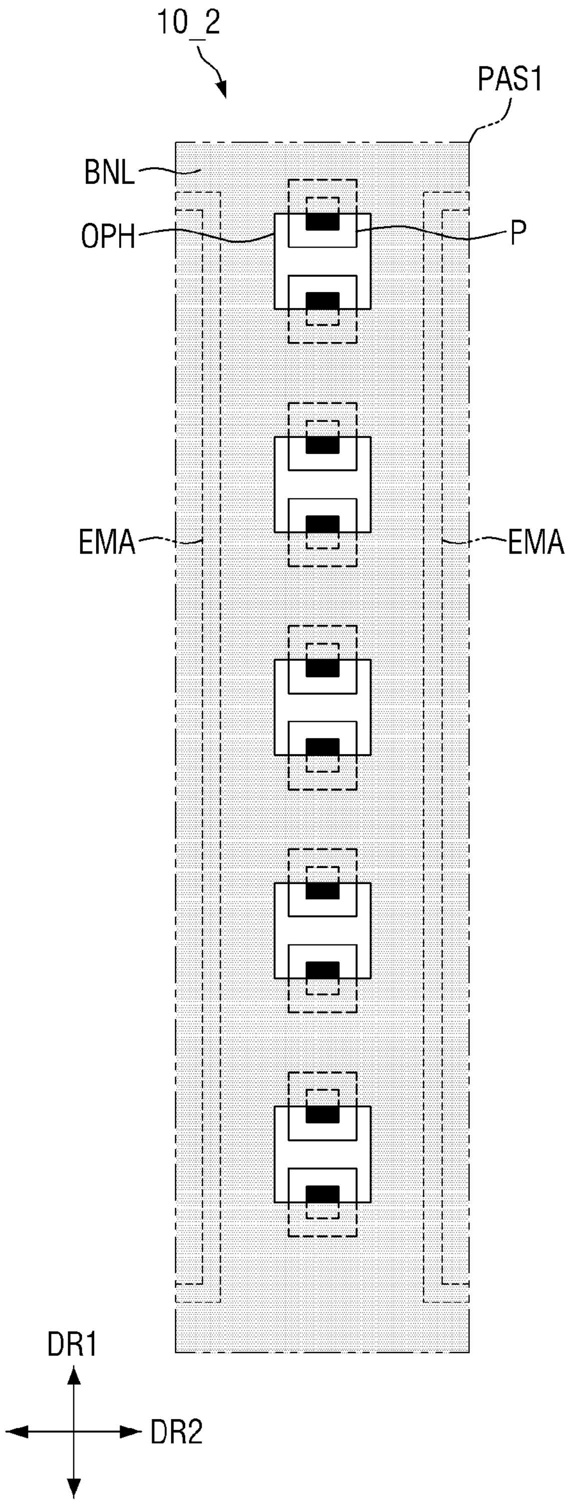
FIG. 13 is a plan view illustrating a trench portion formed in a bank layer and an opening hole formed in a first insulating layer in a display device according to another embodiment.

FIG. 13 is a plan view illustrating an arrangement of a trench portion formed in a bank layer and an opening hole formed in a first insulating layer in a display device according to another embodiment.

Referring to FIG. 13, in a display device 10_2 according to one embodiment, each of the trench portions P of the bank layer BNL may partially overlap an opening hole OPH in the first insulating layer PAS1. Each of the trench portions P and the opening holes OPH may be disposed in a portion of the bank layer BNL extending in the first direction DR1, and the opening hole OPH may be disposed to overlap each of different trench portions P. In a plan view, the center of the opening hole OPH may be located between the trench portions P spaced apart from each other in the first direction DR1, and the opening hole OPH may have a width sufficient to overlap each of two adjacent trench portions P. As described above, the arrangement of the trench portions P in the bank layer BNL and the opening holes OPH in the first insulating layer PAS1 may not be particularly limited.

Figure 14:
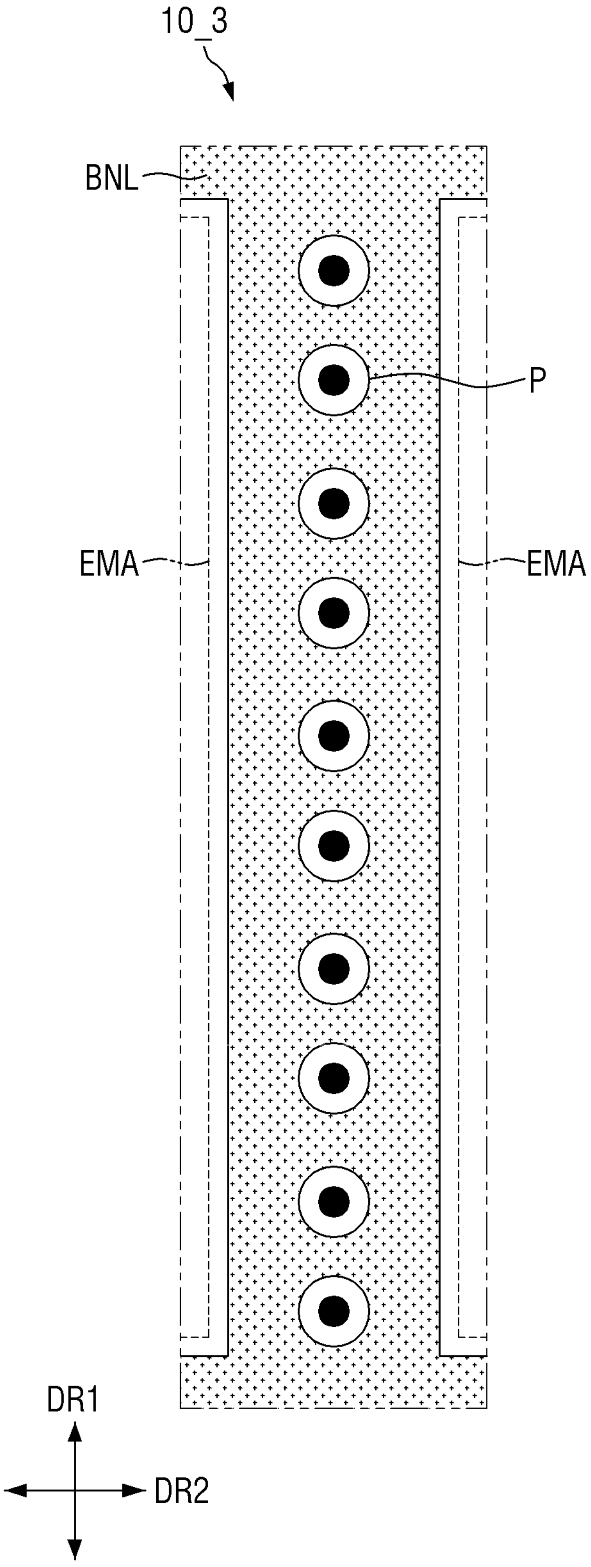
FIGS. 14 and 15 are plan views illustrating a trench portion formed in a bank layer in a display device according to another embodiment.
Figure 15:
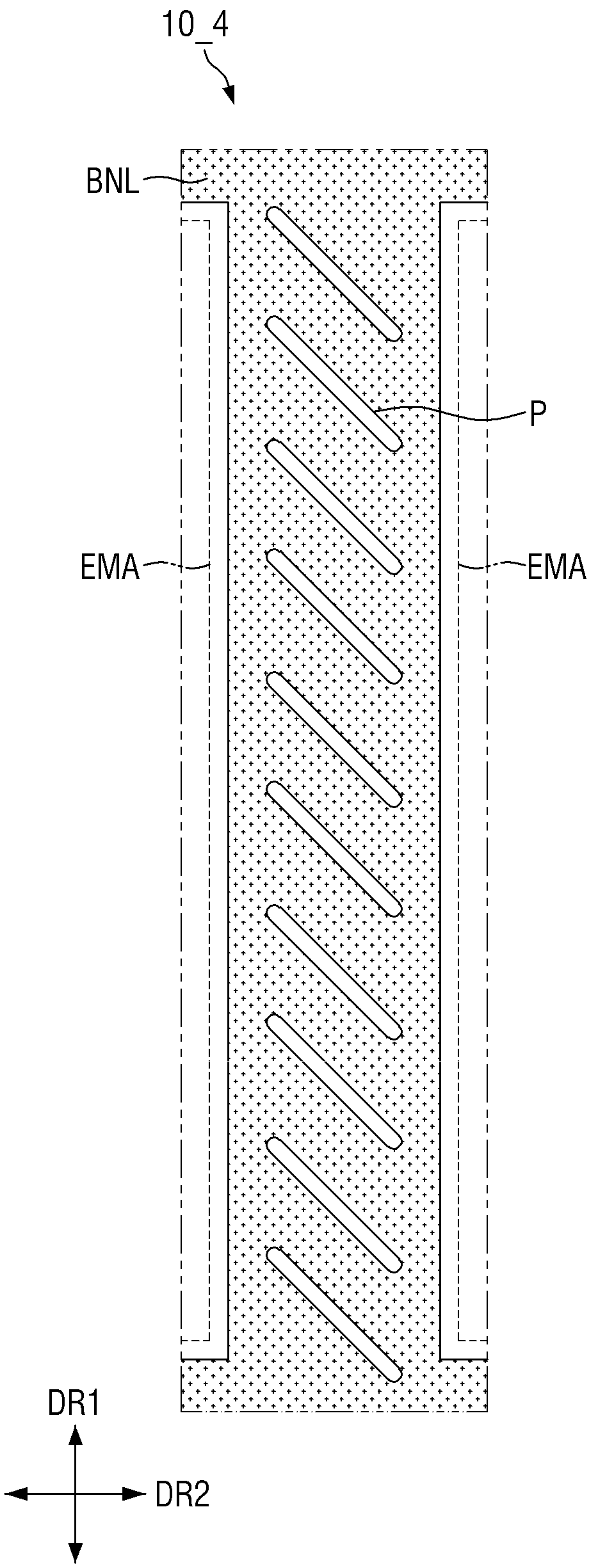

FIGS. 14 and 15 are plan views illustrating a trench portion formed in a bank layer in a display device according to another embodiment.

Referring to FIGS. 14 and 15, in display devices 10_3 and 10_4 according to one embodiment, the shapes of the trench portions P in the bank layer BNL may be variously changed. In the display device 10_3 shown in FIG. 14, the trench portion P may have a circular shape in a plan view, and in the display device 10_4 shown in FIG. 15, the trench portion P may have a slit shape extending in one direction in a plan view. The shape of the opening hole OPH of the first insulating layer PAS1 may be the same as the shape of the trench portion P or may have the shape as shown in, for example, FIG. 3.

Because the trench portion P is formed by partially depressing the top surface of the bank layer BNL, the trench portion P may contribute to an increase in the volume of the ink. As long as the volume of the ink can be increased, the shape of the trench portion P may be variously changed. When the trench portion P has the maximum width PW1 (see, e.g., FIG. 8) such that the light emitting element ED cannot enter therein, the shape of the trench portion P may have various structures (or shapes) in a plan view.

Figure 16:
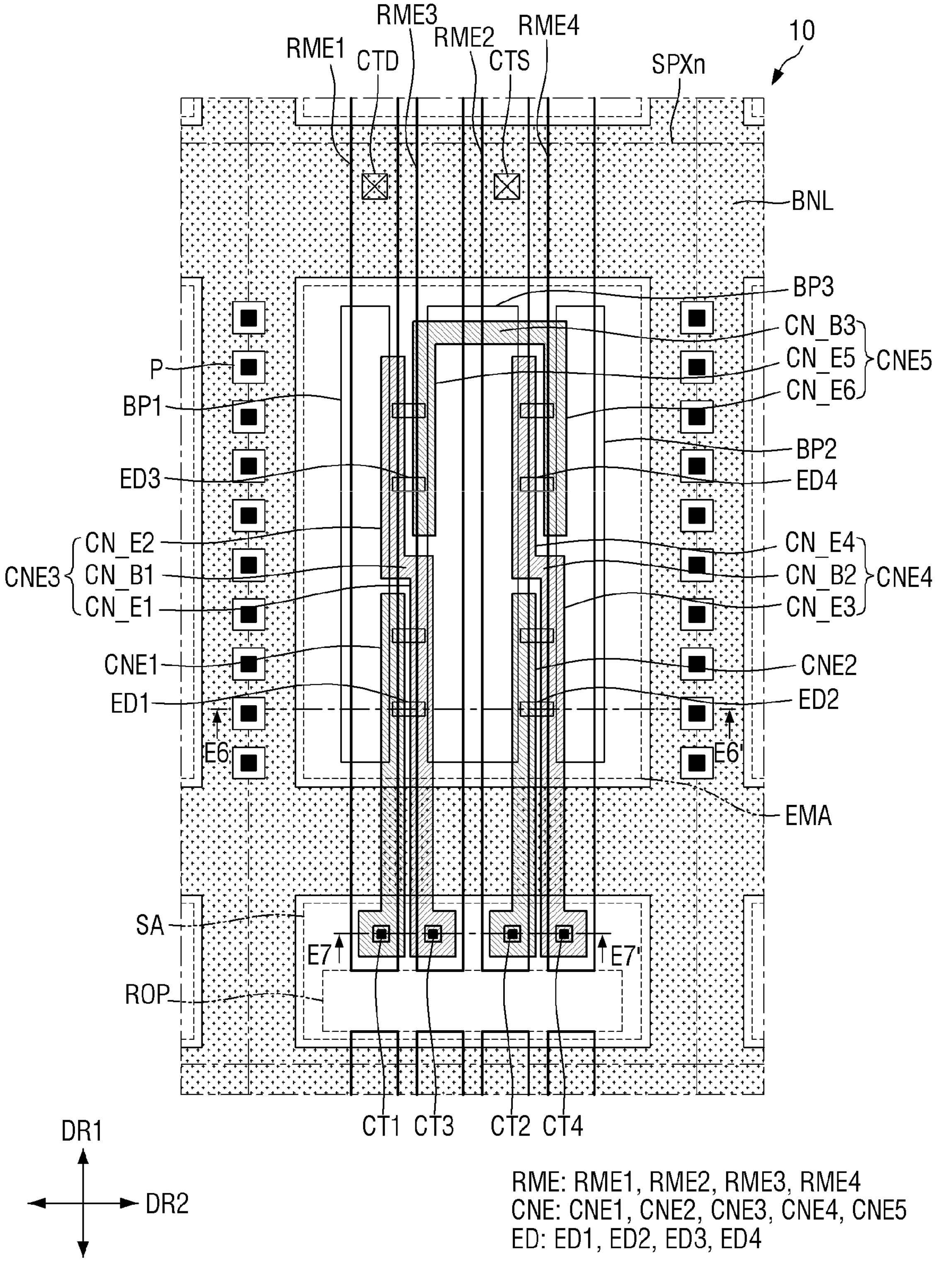
FIG. 16 is a plan view illustrating a sub-pixel of a display device according to another embodiment.
Figure 17:
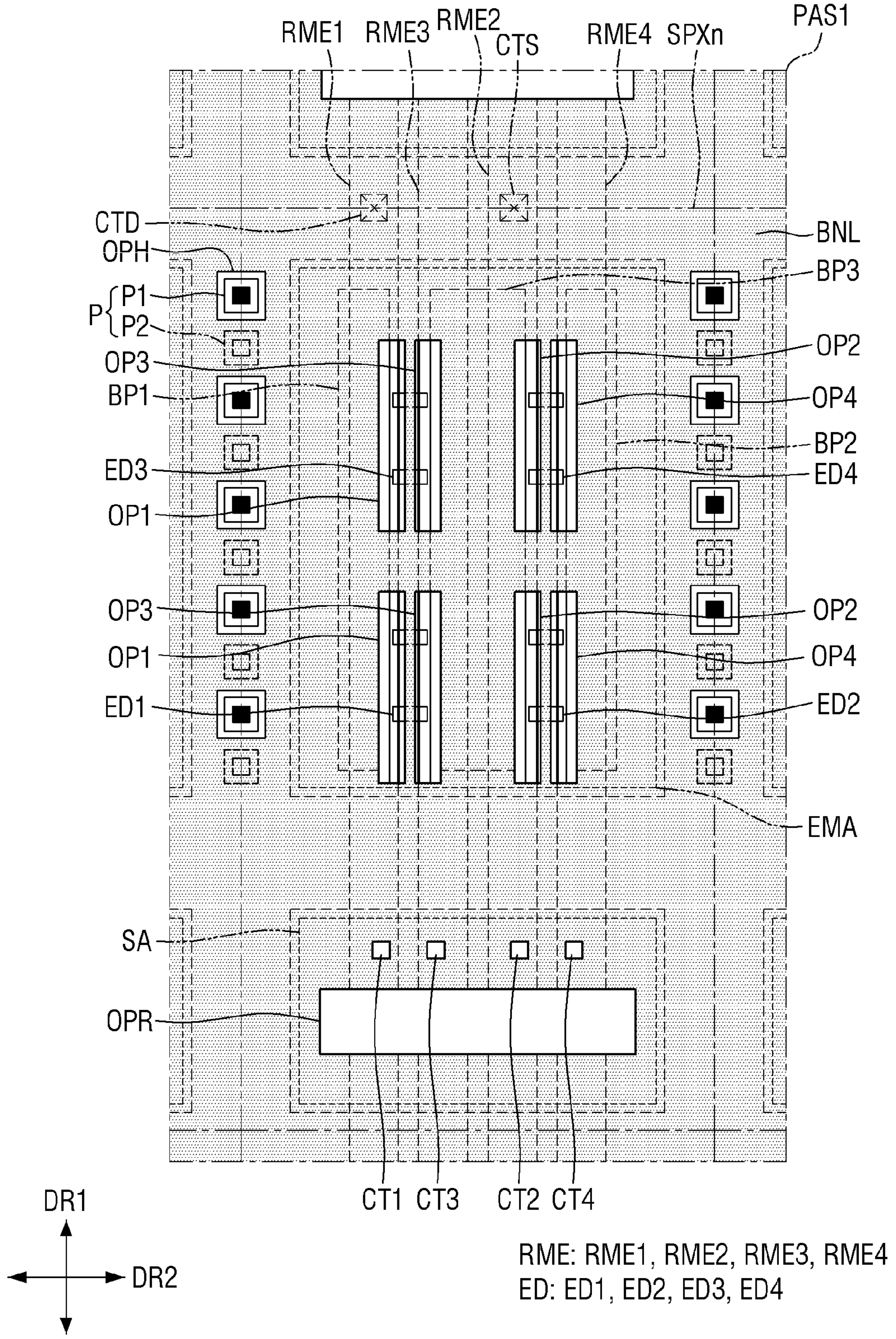
FIG. 17 is a plan view illustrating an arrangement of a first insulating layer and a bank layer disposed in one sub-pixel in the display device shown in FIG. 16.
Figure 18:
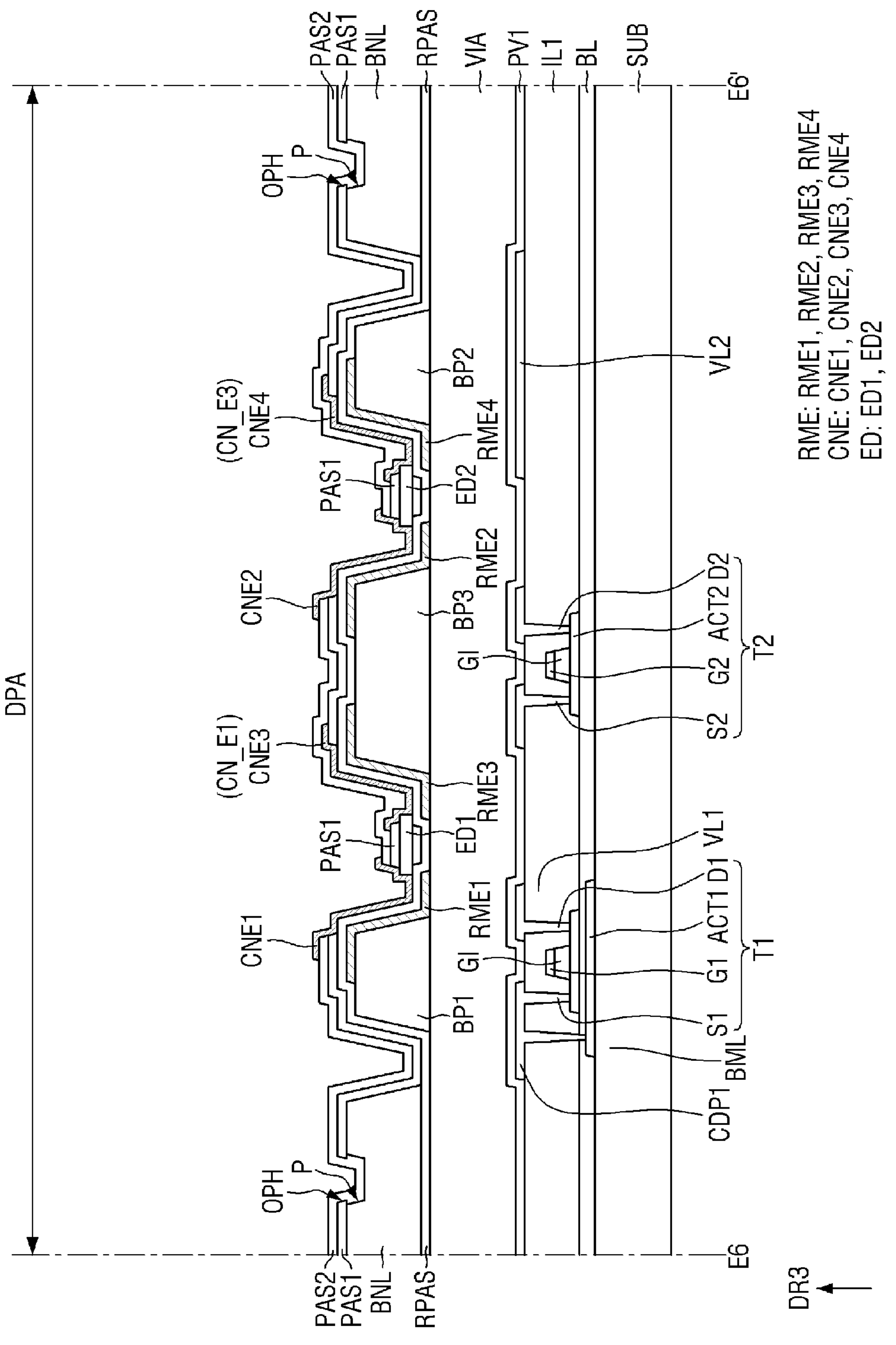
FIG. 18 is a cross-sectional view taken along the line E6-E6' of FIG. 16.
Figure 19:
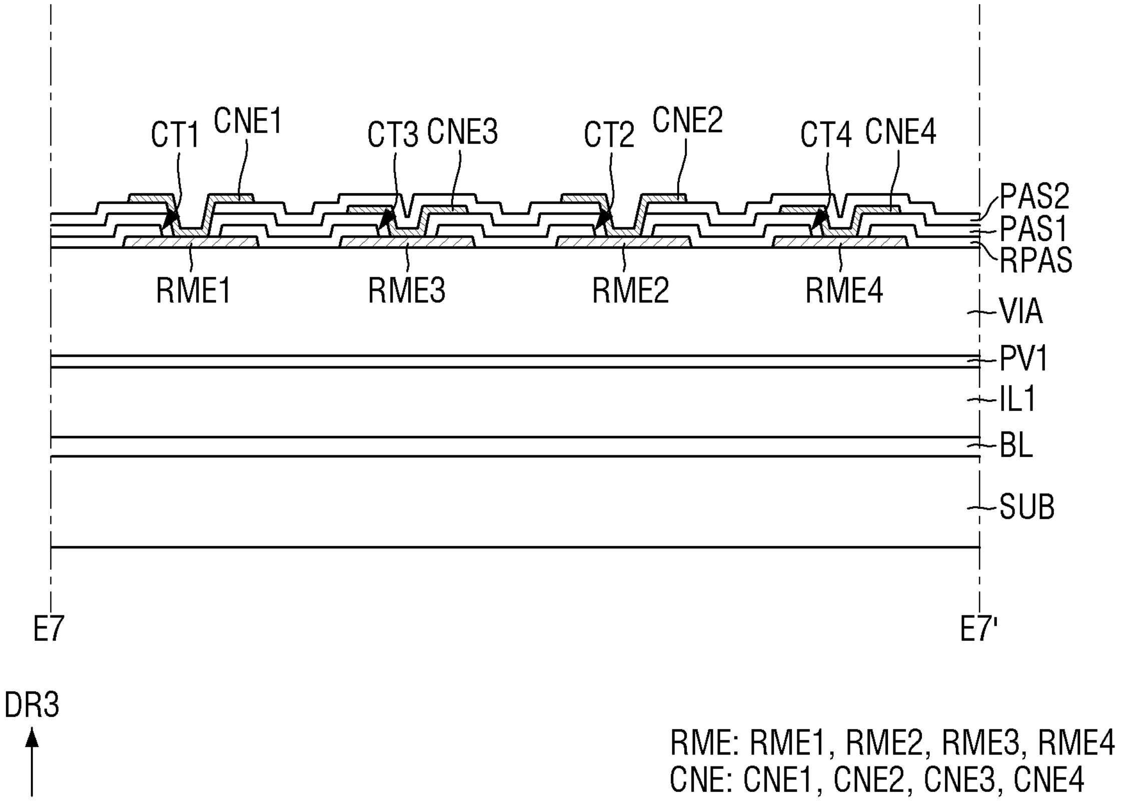
FIG. 19 is a cross-sectional view taken along the line E7-E7' of FIG. 16.

FIG. 16 is a plan view illustrating a sub-pixel of a display device according to another embodiment. FIG. 17 is a plan view illustrating an arrangement of a first insulating layer and a bank layer disposed in one sub-pixel in the display device shown in FIG. 16. FIG. 18 is a cross-sectional view taken along the line E6-E6' of FIG. 16. FIG. 19 is a cross-sectional view taken along the line E7-E7' of FIG. 16.

FIG. 16 illustrates the arrangement of bank patterns BP1, BP2, and BP3, electrodes RME1, RME2, RME3, and RME4, the bank layer BNL, the light emitting elements ED, and connection electrodes CNE1, CNE2, CNE3, CNE4, and CNE5 disposed in one sub-pixel SPXn in a plan view. FIG. 17 illustrates the arrangement of the bank layer BNL, the electrodes RME1, RME2, RME3, and RME4, and the first insulating layer PAS1 in a plan view. FIG. 18 illustrates a cross section traversing both ends of a first light emitting element ED1 and a second light emitting element ED2 disposed in one sub-pixel SPXn. FIG. 19 illustrates a cross section traversing a plurality of contact portions CT1, CT2, CT3, and CT4 disposed in one sub-pixel SPXn.

Referring to FIGS. 16 to 19, the display device 10 according to one embodiment may include a greater number of electrodes RME (e.g., RME1, RME2, RME3, and RME4), bank patterns BP1, BP2, and BP3, light emitting elements ED (e.g., ED1, ED2, ED3, and ED4) and connection electrodes CNE (e.g., CNE1, CNE2, CNE3, CNE4, and CNE5). The display device 10, according to this embodiment, is different from the embodiment shown in FIG. 2 in that a greater number of electrodes and a greater number of light emitting elements are included in each sub-pixel SPXn.

The bank patterns BP1, BP2, and BP3 may further include a third bank pattern BP3 disposed between the first bank pattern BP1 and the second bank pattern BP2. The first bank pattern BP1 may be located on the left side with respect to the center of the emission area EMA, the second bank pattern BP2 may be located on the right side with respect to the center of the emission area EMA, and the third bank pattern BP3 may be located at the center of the emission area EMA. The width of the third bank pattern BP3 measured in the second direction DR2 may be greater than that of the first bank pattern BP1 and the second bank pattern BP2 measured in the second direction DR2. The gap between the bank patterns BP1, BP2, and BP3 in the second direction DR2 may be greater than the gap between the electrodes RME. The first bank pattern BP1 may be disposed to partially overlap the first electrode RME1, and the second bank pattern BP2 may be disposed to partially overlap the fourth electrode RME4. The third bank pattern BP3 may be disposed to partially overlap the second electrode RME2 and the third electrode RME3. At least parts of the electrodes RME may be arranged without overlapping the bank patterns BP1, BP2, and BP3.

The plurality of electrodes RME arranged for each sub-pixel SPXn may further include a third electrode RME3 and a fourth electrode RME4 in addition to a first electrode RME1 and a second electrode RME2.

The third electrode RME3 may be disposed between the first electrode RME1 and the second electrode RME2, and the fourth electrode RME4 may be spaced apart from the third electrode RME3 in the second direction DR2 with the second electrode RME2 interposed therebetween. The plurality of electrodes RME may be sequentially arranged, from the left side to the right side of the sub-pixel SPXn, in the order of the first electrode RME1, the third electrode RME3, the second electrode RME2, and the fourth electrode RME4. The electrodes RME may face and be spaced apart from each other in the second direction DR2. The plurality of electrodes RME may be spaced apart from the electrodes RME of another sub-pixel SPXn adjacent in the first direction DR1 at the separation portion ROP of the sub-region SA.

From among the plurality of electrodes RME, the first electrode RME1 and the second electrode RME2 may be in contact with the first conductive pattern CDP1 and the second voltage line VL2 disposed thereunder through the electrode contact holes CTD and CTS disposed under the bank layer BNL, respectively, but the third electrode RME3 and the fourth electrode RME4 may not be in contact with them.

The lower insulating layer RPAS may be disposed in a structure similar to that in the above-described embodiments. The lower insulating layer RPAS may be disposed in the entire display area DPA and may cover the plurality of electrodes RME and the bank patterns BP1, BP2, and BP3.

According to one embodiment, the lower insulating layer RPAS may include the plurality of contact portions CT1, CT2, CT3, and CT4. The contact portions CT1, CT2, CT3, and CT4 of the lower insulating layer RPAS may be disposed to overlap different electrodes RME, respectively. For example, the plurality of contact portions CT1, CT2, CT3, and CT4 may be disposed in the sub-region SA and may include the first contact portion CT1 disposed to overlap the first electrode RME1, the second contact portion CT2 disposed to overlap the second electrode RME2, the third contact portion CT3 disposed to overlap the third electrode RME3, and the fourth contact portion CT4 disposed to overlap the fourth electrode RME4. The plurality of contact portions CT1, CT2, CT3, and CT4 may penetrate the lower insulating layer RPAS to partially expose the top surfaces of the electrodes RME1, RME2, RME3, and RME4 disposed thereunder, respectively. Each of the contact portions CT1, CT2, CT3, and CT4 may further penetrate some of the other insulating layers disposed on the lower insulating layer RPAS.

The bank layer BNL may be disposed on the lower insulating layer RPAS. The bank layer BNL may include portions extending in the first direction DR1 and the second direction DR2 and may surround (e.g., may extend around a periphery of) the sub-pixels SPXn. The bank layer BNL may surround the emission area EMA and the sub-region SA of each sub-pixel SPXn to distinguish them. The arrangement of the bank layer BNL is substantially the same as described above. The bank layer BNL may include the plurality of trench portions P disposed between the emission areas EMA of adjacent sub-pixels SPXn.

The plurality of light emitting elements ED may be arranged between the bank patterns BP1, BP2, and BP3 or on different electrodes RME. Some of the light emitting elements ED may be arranged between the first bank pattern BP1 and the third bank pattern BP3, and some other light emitting elements ED may be arranged between the third bank pattern BP3 and the second bank pattern BP2. In accordance with one embodiment, the light emitting element ED may include a first light emitting element ED1 and a third light emitting element ED3 arranged between the first bank pattern BP1 and the third bank pattern BP3, and a second light emitting element ED2 and a fourth light emitting element ED4 arranged between the third bank pattern BP3 and the second bank pattern BP2. Each of the first light emitting element ED1 and the third light emitting element ED3 may be disposed above the first electrode RME1 and the third electrode RME3, and each of the second light emitting element ED2 and the fourth light emitting element ED4 may be disposed above the second electrode RME2 and the fourth electrode RME4. The first light emitting element ED1 and the second light emitting element ED2 may be arranged adjacent to the lower side (in the drawings) of the emission area EMA of the corresponding sub-pixel SPXn or adjacent to the sub-region SA, and the third light emitting element ED3 and the fourth light emitting element ED4 may be arranged adjacent to the upper side (in the drawings) of the emission area EMA of the corresponding sub-pixel SPXn.

However, the light emitting elements ED may not be classified according to the arrangement position in the emission area EMA but may be classified according to a connection relationship with the connection electrode CNE, which will be described later. Opposite ends of each light emitting element ED may be in contact with different connection electrodes CNE according to an arrangement method of the connection electrodes CNE. The light emitting elements ED may be classified into different types of light emitting elements ED according to the type of the connection electrode CNE in contact therewith.

The first insulating layer PAS1 may be disposed in a structure similar to that of the above-described embodiment. The first insulating layer PAS1 may be disposed on the plurality of light emitting elements ED, the lower insulating layer RPAS, and the bank layer BNL.

According to one embodiment, the first insulating layer PAS1 may have a plurality of openings OP1, OP2, OP3, OP4, and OPR, the plurality of contact portions CT1, CT2, CT3, and CT4, and the plurality of opening holes OPH. The separation opening OPR formed to correspond to the separation portion ROP of the sub-region SA, which is the opening of the first insulating layer PAS1, is the same as that described above with reference to FIG. 3.

The first insulating layer PAS1 may include, in addition to the plurality of first openings OP1 partially overlapping the first electrode RME1 and the plurality of second openings OP2 partially overlapping the second electrode RME2, the plurality of third openings OP3 partially overlapping the third electrode RME3 and the plurality of fourth openings OP4 partially overlapping the fourth electrode RME4.

The first openings OP1 and the second openings OP2 may be disposed in the emission area EMA and may expose both ends (e.g., opposite ends) of the light emitting elements ED. The first openings OP1 may expose (or may not cover) the first ends of the light emitting elements ED that are disposed on the first electrode RME1, and the second openings OP2 may expose (or may not cover) the second ends of the light emitting elements ED that are disposed on the second electrode RME2.

The first openings OP1 may be disposed to overlap one side of the first electrode RME1 that faces the third electrode RME3, and the different first openings OP1 disposed in one sub-pixel SPXn may be disposed to be spaced apart from each other in the first direction DR1 in the emission area EMA of the corresponding sub-pixel SPXn. One first opening OP1 may expose the first ends of the first light emitting elements ED1, and another first opening OP1 may expose the first ends of the third light emitting elements ED3.

The second openings OP2 may be disposed to overlap one side of the second electrode RME2 that faces the fourth electrode RME4, and the different second openings OP2 disposed in one sub-pixel SPXn may be disposed to be spaced apart from each other in the first direction DR1 in the emission area EMA of the corresponding sub-pixel SPXn. One second opening OP2 may expose the first ends of the second light emitting elements ED2, and another second opening OP2 may expose the first ends of the fourth light emitting elements ED4.

Similarly, the third openings OP3 may be disposed to overlap one side of the third electrode RME3 that faces the first electrode RME1, and the different third openings OP3 disposed in one sub-pixel SPXn may be disposed to be spaced apart from each other in the first direction DR1 in the emission area EMA of the corresponding sub-pixel SPXn. One third opening OP3 may expose the second ends of the first light emitting elements ED1, and another third opening OP3 may expose the second ends of the third light emitting elements ED3.

The fourth openings OP4 may be disposed to overlap one side of the fourth electrode RME4 that faces the second electrode RME2, and the different fourth openings OP4 disposed in one sub-pixel SPXn may be disposed to be spaced apart from each other in the first direction DR1 in the emission area EMA of the corresponding sub-pixel SPXn. One fourth opening OP4 may expose the second ends of the second light emitting elements ED2, and another fourth opening OP4 may expose the second ends of the fourth light emitting elements ED4.

According to one embodiment, the first insulating layer PAS1 may have the opening holes OPH disposed in the bank layer BNL. The opening holes OPH may be disposed in a portion of the bank layer BNL extending in the first direction DR1 and may partially overlap the trench portion P. The opening hole OPH is the same as described above with reference to FIGS. 2 to 9. In the display device 10 of the embodiment, the opening hole OPH may be disposed to overlap some of the trench portions P, and the trench portions P may include the first trench portion P1 and the second trench portion P2. However, the present disclosure is not limited thereto.

The plurality of connection electrodes CNE may further include, in addition to the first connection electrode CNE1 disposed on the first electrode RME1, the second connection electrode CNE2 disposed on the second electrode RME2, a third connection electrode CNE3, a fourth connection electrode CNE4, and a fifth connection electrode CNE5 arranged across the plurality of electrodes RME.

Different from the embodiment shown in FIGS. 2 to 6, the extension length of each of the first connection electrode CNE1 and the second connection electrode CNE2 in the first direction DR1 may be relatively short. The first connection electrode CNE1 and the second connection electrode CNE2 may be arranged on the lower side with respect to the center of the emission area EMA. The first connection electrode CNE1 and the second connection electrode CNE2 may be disposed across the emission area EMA and the sub-region SA of the corresponding sub-pixel SPXn and may be in direct contact with the electrode RME through the contact portions CT1 and CT2 formed in the sub-region SA, respectively. The first connection electrode CNE1 may be in direct contact with the first electrode RME1 through the first contact portion CT1 penetrating the lower insulating layer RPAS, the first insulating layer PAS1, and the second insulating layer PAS2 in the sub-region SA, and the second connection electrode CNE2 may be in direct contact with the second electrode RME2 through the second contact portion CT2 penetrating the lower insulating layer RPAS, the first insulating layer PAS1, and the second insulating layer PAS2 in the sub-region SA.

The third connection electrode CNE3 may include a first extension portion CN_E1 disposed on the third electrode RME3, a second extension portion CN_E2 disposed on the first electrode RME1, and a first connection portion CN_B1 that connects the first extension portion CN_E1 to the second extension portion CN_E2.

The first extension portion CN_E1 may be spaced apart from the first connection electrode CNE1 in the second direction DR2, and the second extension portion CN_E2 may be spaced apart from the first connection electrode CNE1 in the first direction DR1. The first extension portion CN_E1 may be disposed on the lower side (in the drawings) of the emission area EMA of the corresponding sub-pixel SPXn, and the second extension portion CN_E2 may be disposed on the upper side (in the drawings) of the emission area EMA. The first extension portion CN_E1 and the second extension portion CN_E2 may be disposed in the emission area EMA. The first connection portion CN_B1 may be disposed across the first electrode RME1 and the third electrode RME3 at the central portion of the emission area EMA. The third connection electrode CNE3 may have a shape substantially extending in the first direction DR1 and may have a shape that is bent in the second direction DR2 and extends in the first direction DR1 again.

The fourth connection electrode CNE4 may include a third extension portion CN_E3 disposed on the fourth electrode RME4, a fourth extension portion CN_E4 disposed on the second electrode RME2, and a second connection portion CN_B2 that connects the third extension portion CN_E3 to the fourth extension portion CN_E4. The third extension portion CN_E3 may face and be spaced apart from the second connection electrode CNE2 in the second direction DR2, and the fourth extension portion CN_E4 may be spaced apart from the second connection electrode CNE2 in the first direction DR1. The third extension portion CN_E3 may be disposed on the lower side of the emission area EMA of the corresponding sub-pixel SPXn, and the fourth extension portion CN_E4 may be disposed on the upper side of the emission area EMA. The third extension portion CN_E3 and the fourth extension portion CN_E4 may be disposed in the emission area EMA. The second connection portion CN_B2 may be disposed across the second electrode RME2 and the fourth electrode RME4 while being adjacent to the center of the emission area EMA. The fourth connection electrode CNE4 may have a shape substantially extending in the first direction DR1 and may have a shape that is bent in the second direction DR2 and extends in the first direction DR1 again.

The fifth connection electrode CNE5 may include a fifth extension portion CN_E5 disposed on the third electrode RME3, a sixth extension portion CN_E6 disposed on the fourth electrode RME4, and a third connection portion CN_B3 that connects the fifth extension portion CN_E5 to the sixth extension portion CN_E6. The fifth extension portion CN_E5 may face and be spaced apart from the second extension portion CN_E2 of the third connection electrode CNE3 in the second direction DR2, and the sixth extension portion CN_E6 may face and be spaced apart from the fourth extension portion CN_E4 of the fourth connection electrode CNE4 in the second direction DR2. Each of the fifth extension portion CN_E5 and the sixth extension portion CN_E6 may be arranged on the upper side of the emission area EMA, and the third connection portion CN_B3 may be disposed across the third electrode RME3, the second electrode RME2, and the fourth electrode RME4. The fifth connection electrode CNE5 may be disposed to surround the fourth extension portion CN_E4 of the fourth connection electrode CNE4 in a plan view.

The third connection electrode CNE3 may be in direct contact with the third electrode RME3 through the third contact portion CT3 penetrating the lower insulating layer RPAS and the first insulating layer PAS1 in the sub-region SA, and the fourth connection electrode CNE4 may be in direct contact with the fourth electrode RME4 through the fourth contact portion CT4 penetrating the lower insulating layer RPAS and the first insulating layer PAS1 in the sub-region SA.

However, the present disclosure is not limited thereto. In some embodiments of the display device 10, some of the connection electrodes CNE may be directly connected to the third conductive layer. For example, the first connection electrode CNE1 and the second connection electrode CNE2, which are first-type connection electrodes, may be directly connected to the third conductive layer and may not be electrically connected to the electrode RME. A second type connection electrode and a third type connection electrode may not be electrically connected to the electrode RME and may be connected only to the light emitting elements ED.

The first connection electrode CNE1 and the second connection electrode CNE2 may be the first-type connection electrodes connected to the electrodes RME1 and RME2 that are directly connected to the third conductive layer, respectively. The third connection electrode CNE3 and the fourth connection electrode CNE4 may be second-type connection electrodes connected to the electrodes RME3 and RME4 that are not connected to the third conductive layer. The fifth connection electrode CNE5 may be a third-type connection electrode that is not connected to the electrode RME. The fifth connection electrode CNE5 may be in contact with the light emitting elements ED without being connected to the electrode RME and may constitute an electrical connection circuit of the light emitting elements ED together with other connection electrodes CNE.

The third connection electrode CNE3 and the fourth connection electrode CNE4, that are the second-type connection electrodes, may be connection electrodes in which electrode extension portions extending in the first direction DR1 are not parallel to each other in the second direction DR2. The fifth connection electrode CNE5, that is the third-type connection electrode, may be the connection electrode in which electrode extension portions extending in the first direction DR1 are parallel to each other in the second direction DR2. The third connection electrode CNE3 and the fourth connection electrode CNE4 may have a shape that is bent while extending in the first direction DR1, and the fifth connection electrode CNE5 may have a shape surrounding (or extending around) a part of another connection electrode.

The second insulating layer PAS2 may have a structure similar to that of the above-described embodiment. The second insulating layer PAS2 may be disposed on the first insulating layer PAS1 except the region in which the second connection electrode layer is disposed.

The plurality of contact portions CT1 and CT2 formed in the second insulating layer PAS2 may be disposed to overlap different electrodes RME, respectively. For example, the second insulating layer PAS2 may include the first contact portion CT1 disposed to overlap the first electrode RME1, and the second contact portion CT2 disposed to overlap the second electrode RME2. The first contact portion CT1 and the second contact portion CT2 may penetrate the first insulating layer PAS1 and the second insulating layer PAS2 to expose a part (or portion) of the top surfaces of the first electrode RME1 and the second electrode RME2 therebelow.

The first connection electrode CNE1 may be disposed to partially overlap the first opening OP1 disposed below the emission area EMA. The second connection electrode CNE2 may be disposed to partially overlap the second opening OP2 disposed below the emission area EMA. The third connection electrode CNE3 may be disposed to partially overlap the third opening OP3 disposed below the emission area EMA and the first opening OP1 disposed above the emission area EMA. The fourth connection electrode CNE4 may be disposed to partially overlap the fourth opening OP4 disposed below the emission area EMA and the second opening OP2 disposed above the emission area EMA. The fifth connection electrode CNE5 may be disposed to partially overlap the third opening OP3 disposed above the emission area EMA and the second opening OP2 disposed above the emission area EMA.

The first connection electrode CNE1 may be in contact with the first end of the first light emitting element ED1 exposed through the first opening OP1, and the second connection electrode CNE2 may be in contact with the second end of the second light emitting element ED2 exposed through the second opening OP2. The third connection electrode CNE3 may be in contact with the second end of the first light emitting element ED1 exposed through the third opening OP3, and the first end of the third light emitting element ED3 exposed through the first opening OP1. The fourth connection electrode CNE4 may be in contact with the second end of the fourth light emitting element ED4 exposed through the second opening OP2, and the first end of the second light emitting element ED2 exposed through the fourth opening OP4. The fifth connection electrode CNE5 may be in contact with the second end of the third light emitting element ED3 exposed through the third opening OP3, and the first end of the fourth light emitting element ED4 exposed through the fourth opening OP4.

The plurality of light emitting elements ED may be classified into different light emitting elements ED depending on the connection electrodes CNE to be in contact with both ends of the light emitting elements ED to correspond to the arrangement structure of the connection electrodes CNE. The first light emitting element ED1 and the second light emitting element ED2 may have first ends in contact with the first-type connection electrodes and second ends in contact with the second-type connection electrodes. The first light emitting element ED1 may be in contact with the first connection electrode CNE1 and the third connection electrode CNE3, and the second light emitting element ED2 may be in contact with the second connection electrode CNE2 and the fourth connection electrode CNE4. The third light emitting element ED3 and the fourth light emitting element ED4 may have first ends in contact with the second-type connection electrodes and second ends in contact with the third-type connection electrodes. The third light emitting element ED3 may be in contact with the third connection electrode CNE3 and the fifth connection electrode CNE5, and the fourth light emitting element ED4 may be in contact with the fourth connection electrode CNE4 and the fifth connection electrode CNE5.

The plurality of light emitting elements ED may be connected in series through the plurality of connection electrodes CNE. Because the display device 10 according to the embodiment includes a greater number of light emitting elements ED for each sub-pixel SPXn and the light emitting elements ED are connected in series, the light emission amount per unit area may be further increased.

Figure 20:
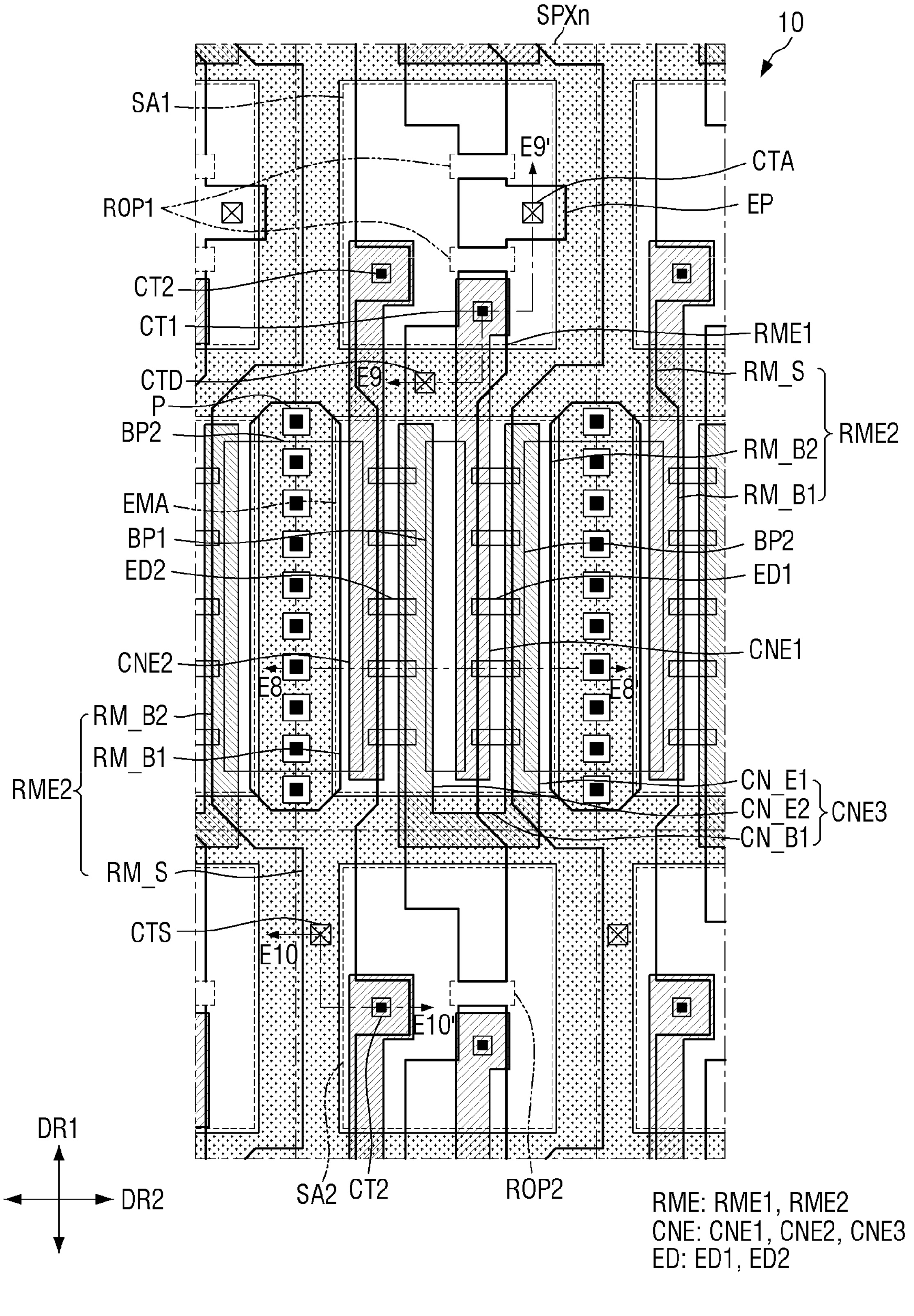
FIG. 20 is a plan view illustrating a sub-pixel of a display device according to another embodiment.
Figure 21:
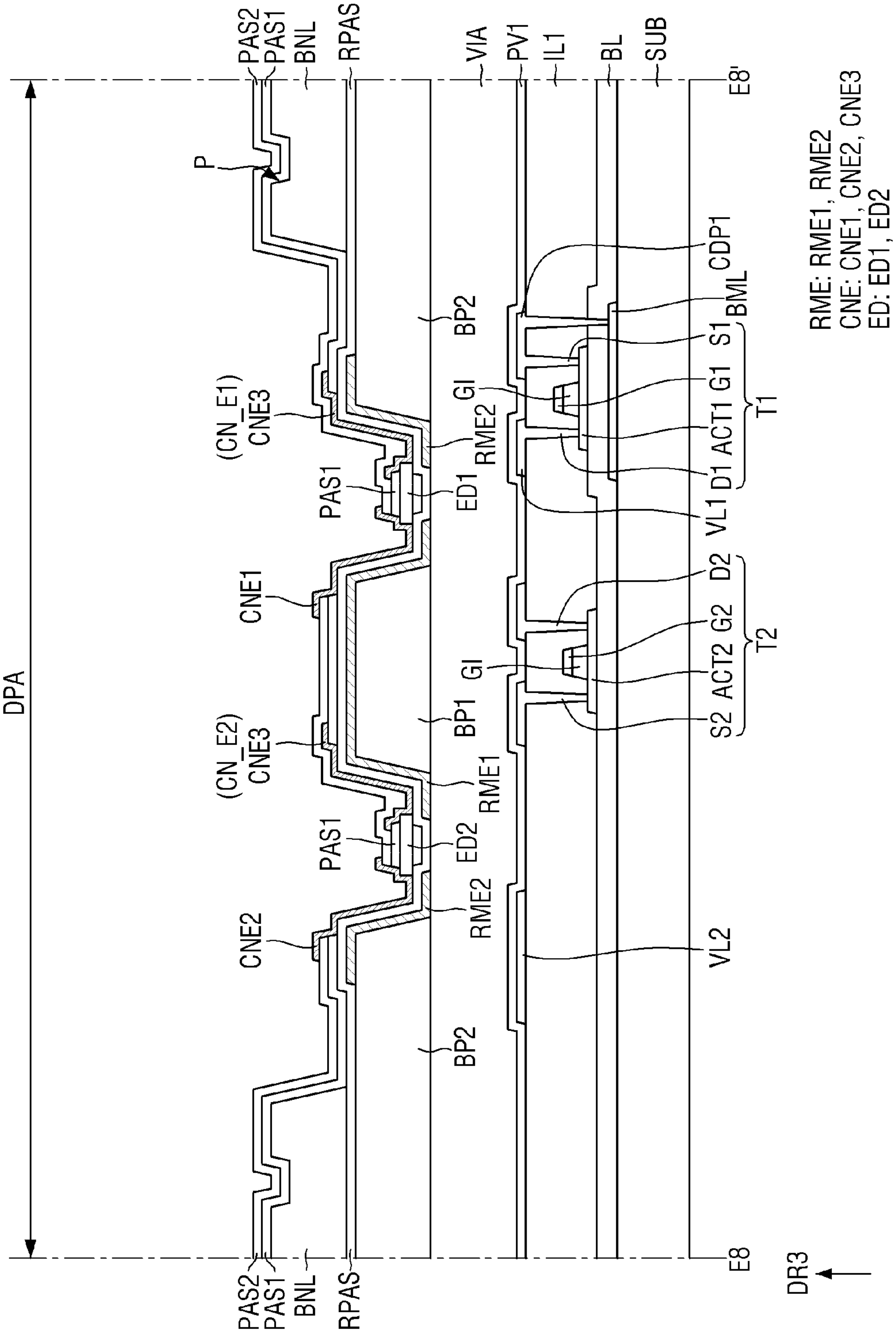
FIG. 21 is a cross-sectional view taken along the line E8-E8' in FIG. 20.
Figure 22:
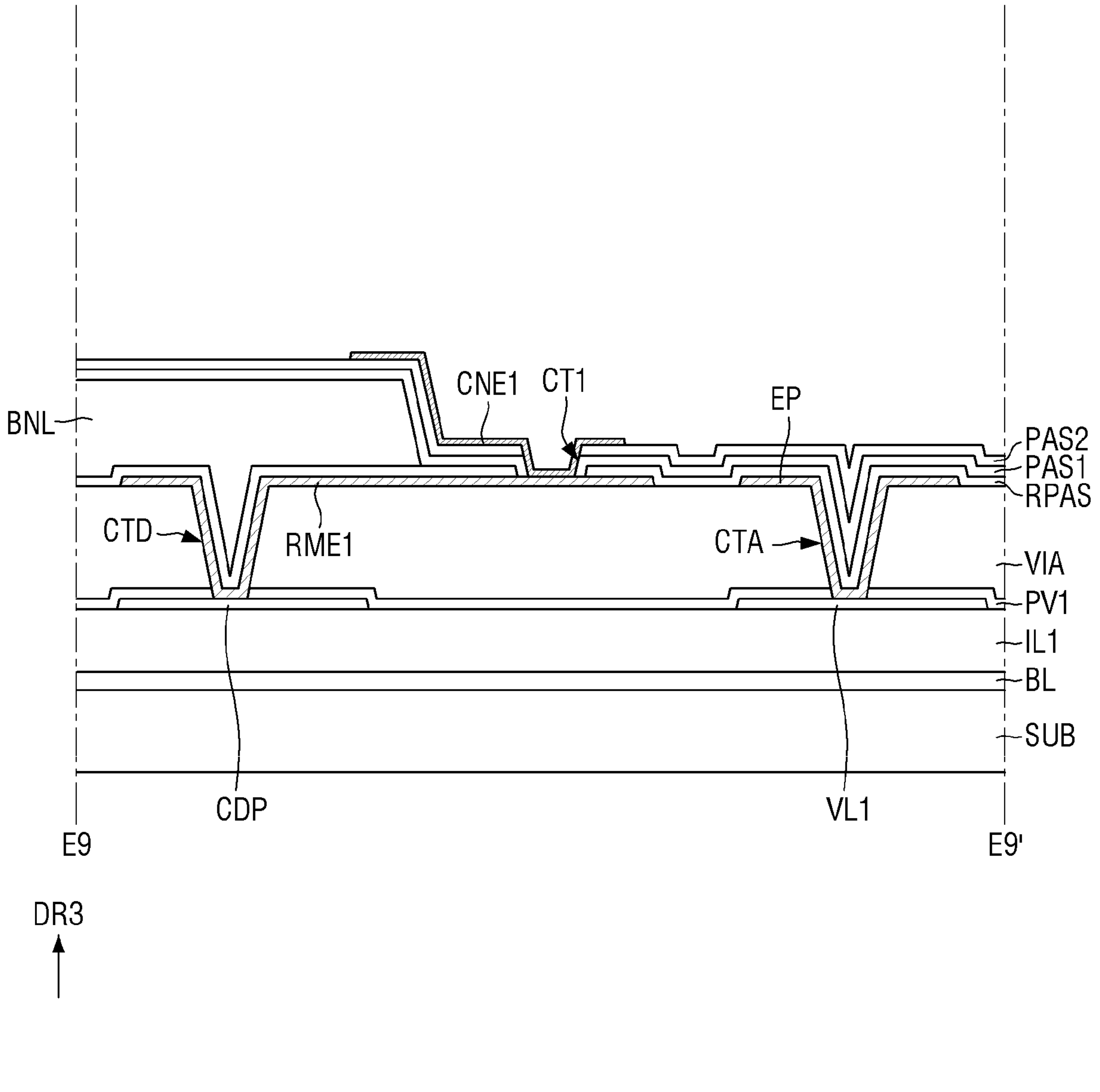
FIG. 22 is a cross-sectional view taken along the line E9-E9' in FIG. 20.
Figure 23:
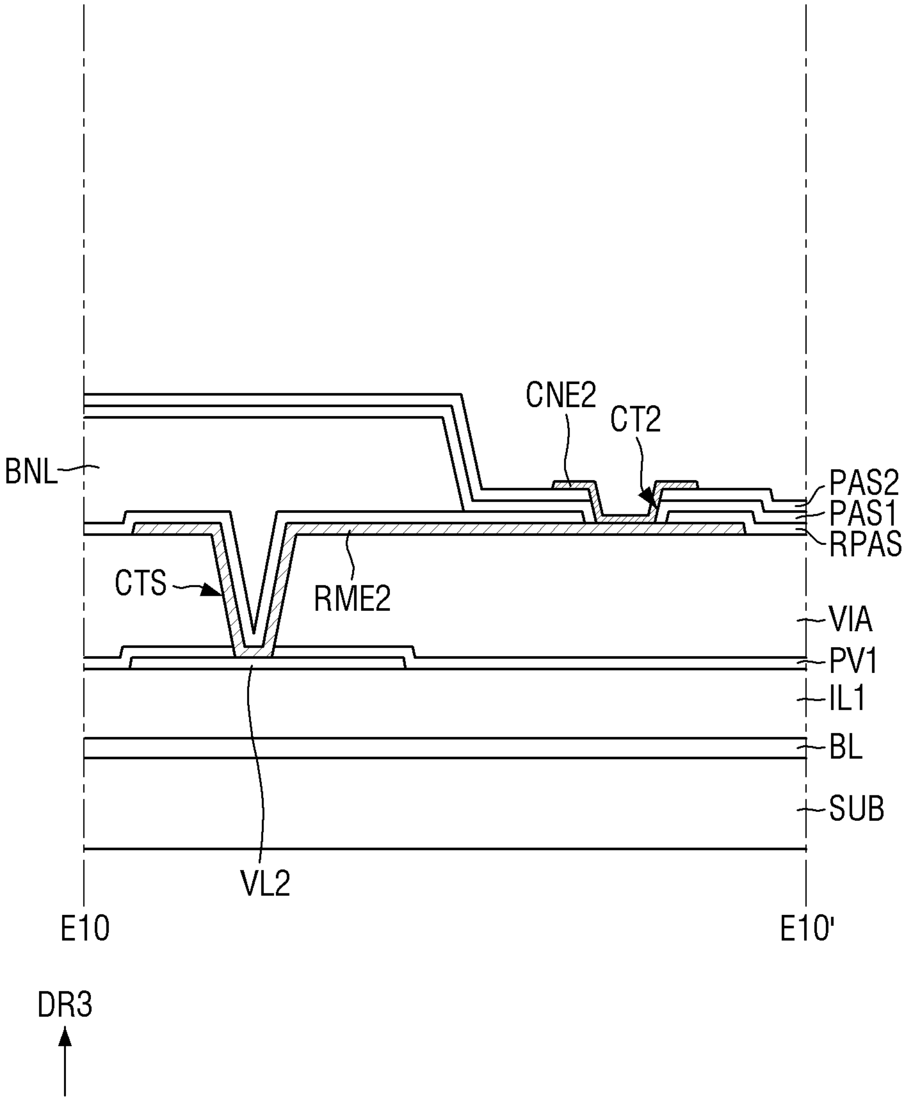
FIG. 23 is a cross-sectional view taken along the line E10-E10' of FIG. 20.

FIG. 20 is a plan view illustrating a sub-pixel of a display device according to another embodiment. FIG. 21 is a cross-sectional view taken along the line E8-E8' in FIG. 20. FIG. 22 is a cross-sectional view taken along the line E9-E9' in FIG. 20. FIG. 23 is a cross-sectional view taken along the line E10-E10' of FIG. 20.

FIG. 20 illustrates planar arrangement of the electrodes RME (e.g., RME1 and RME2), the bank patterns BP1 and BP2, the bank layer BNL, the plurality of light emitting elements ED, and the connection electrodes CNE (e.g., CNE1, CNE2, and CNE3) disposed in one sub-pixel SPXn of the display device 10. FIG. 21 illustrates a cross section across both ends of the light emitting elements ED (e.g., ED1 and ED2) disposed on different electrodes RME. FIGS. 22 and 23 illustrate cross sections across a plurality of electrode contact holes CTD, CTS, and CTA, and the contact portions CT1 and CT2.

Referring to FIGS. 20 to 23, in the display device 10 according to one embodiment, the structures of the electrode RME, the connection electrode CNE, and the bank patterns BP1 and BP2 may be different from those in the above-described embodiments. Hereinafter, the redundant description of the above-described embodiments will be omitted and differences therebetween will be primarily described.

The plurality of bank patterns BP1 and BP2 may have a shape extending in the first direction DR1 and may have different widths measured in the second direction DR2. Any one of the bank patterns BP1 and BP2 may be disposed across the sub-pixels SPXn adjacent in the second direction DR2. For example, the bank patterns BP1 and BP2 may include the first bank pattern BP1 disposed in the emission area EMA of each sub-pixel SPXn and the second bank pattern BP2 disposed across the emission areas EMA of different sub-pixels SPXn.

The first bank pattern BP1 is disposed in the center of the emission areas EMA, and the second bank patterns BP2 are disposed to be spaced apart from the first bank pattern BP1 interposed therebetween. The first bank pattern BP1 and the second bank pattern BP2 may be alternately disposed along the second direction DR2. The light emitting elements ED may be disposed between the first bank pattern BP1 and the second bank pattern BP2 that are spaced apart from each other.

The first bank pattern BP1 and the second bank pattern BP2 may have the same length in the first direction DR1 but may have different widths measured in the second direction DR2. A portion of the bank layer BNL extending in the first direction DR1 may overlap the second bank pattern BP2 in the thickness direction. The first bank pattern BP1 may be disposed to overlap the first electrode RME1, and the second bank pattern BP2 may be disposed to overlap electrode branch portions RM_B1 and RM_B2 of the second electrode RME2 and the bank layer BNL.

The first bank pattern BP1 and the second bank pattern BP2 may have the same length in the first direction DR1 but may have different widths measured in the second direction DR2. A portion of the bank layer BNL extending in the first direction DR1 may overlap the second bank pattern BP2 in the thickness direction. The bank patterns BP1 and BP2 may be disposed in an island-like pattern on the entire surface of the display area DPA.

The plurality of electrodes RME include the first electrode RME1 disposed at the central portion of each sub-pixel SPXn and the second electrode RME2 disposed across different sub-pixels SPXn. The first electrode RME1 and the second electrode RME2 may substantially have a shape extending in the first direction DR1, and the portions of the first electrode RME1 and the second electrode RME2 disposed in the emission area EMA may have different shapes.

The first electrode RME1 may be disposed at the center (e.g., substantially at the center) of the sub-pixel SPXn, and the portion of the first electrode RME1 disposed in the emission area EMA may be disposed on the first bank pattern BP1. The first electrode RME1 may extend from the sub-region SA in the first direction DR1 to the sub-region SA of another sub-pixel SPXn. The first electrode RME1 may have a shape in which the width measured in the second direction DR2 changes depending on positions, and at least a portion of the first electrode RME1 overlapping the first bank pattern BP1 in the emission area EMA may have a width greater than that of the first bank pattern BP1.

The second electrode RME2 may include a portion extending in the first direction DR1 and portions branched near the emission area EMA. In one embodiment, the second electrode RME2 may include an electrode stem portion RM_S extending in the first direction DR1, the plurality of electrode branch portions RM_B1 and RM_B2 branched from the electrode stem portion RM_S to be bent in the second direction DR2 and extending in the first direction DR1 again. The electrode stem portion RM_S may be disposed to overlap the portion of the bank layer BNL extending in the first direction DR1 and may be disposed at one side in the second direction DR2 of the sub-region SA. The electrode branch portions RM_B1 and RM_B2 may be branched from the electrode stem portion RM_S disposed at the portion of the bank layer BNL extending in the first direction DR1 and the portion of the bank layer BNL extending in the second direction DR2 and may be bent toward both sides in the second direction DR2. The electrode branch portions RM_B1 and RM_B2 may be disposed across the emission area EMA in the first direction DR1 and may be bent again to be integrally connected to the electrode stem portion RM_S. For example, the electrode branch portions RM_B1 and RM_B2 of the second electrode RME2 may be branched on the upper side of the emission area EMA of any one sub-pixel SPXn and may be connected to each other again on the lower side thereof.

The second electrode RME2 may include a first electrode branch portion RM_B1 disposed on the left side of the first electrode RME1 and a second electrode branch portion RM_B2 disposed on the right side of the first electrode RME1. The electrode branch portions RM_B1 and RM_B2 included in one second electrode RME2 may be disposed in the emission areas EMA of the sub-pixels SPXn adjacent in the second direction DR2, and the electrode branch portions RM_B1 and RM_B2 of different second electrodes RME2 may be disposed in one sub-pixel SPXn. The first electrode branch portion RM_B1 of the second electrode RME2 may be disposed on the left side of the first electrode RME1, and the second electrode branch portion RM_B2 of another second electrode RME2 may be disposed on the right side of the first electrode RME1.

The electrode branch portions RM_B1 and RM_B2 of the second electrode RME2 may overlap one side of the second bank pattern BP2. The first electrode branch portion RM_B1 may partially overlap the second bank pattern BP2 disposed on the left side of the first bank pattern BP1, and the second electrode branch portion RM_B2 may partially overlap the second bank pattern BP2 disposed on the right side of the first bank pattern BP1. Both sides of the first electrode RME1 may face and be spaced apart from different electrode branch portions RM_B1 and RM_B2 of different second electrodes RME2, and the gap between the first electrode RME1 and each of the electrode branch portions RM_B1 and RM_B2 may be smaller than the gap between different bank patterns BP1 and BP2.

The width of the first electrode RME1 measured in the second direction DR2 may be greater than the widths of the electrode stem portion RM_S and the electrode branch portions RM_B1 and RM_B2 of the second electrode RME2. The first electrode RME1 may have a width greater than that of the first bank pattern BP1 and may overlap both sides of the first bank pattern BP1, and the second electrode RME2 may have a relatively small width so that the electrode branch portions RM_B1 and RM_B2 may overlap only one side of the second bank pattern BP2.

The first electrode RME1 may be in contact with the first conductive pattern CDP1 of the third conductive layer through the first electrode contact hole CTD at the portion overlapping the portion of the bank layer BNL extending in the second direction DR2. The second electrode RME2 may be in contact with the second voltage line VL2 of the third conductive layer through the second electrode contact hole CTS at the electrode stem portion RM_S. The portion of the first electrode RME1 disposed in the sub-region SA may be disposed to overlap the first contact portion CT1. The second electrode RME2 may have a portion that protrudes from the electrode stem portion RM_S in the second direction DR2 to be disposed in the sub-region SA, and the second electrode RME2 may overlap the second contact portion CT2 at the protruding part.

Between the first electrode RME1 and the second electrode RME2, the first electrode RME1 may extend to separation portions ROP1 and ROP2 of the sub-region SA, and the second electrode RME2 may not be separated in the sub-region SA. One second electrode RME2 may include a plurality of electrode stem portions RM_S and the electrode branch portions RM_B1 and RM_B2 and may have a shape extending in the first direction DR1 and branched near the emission area EMA of each sub-pixel SPXn. The first electrode RME1 may be disposed between the separation portions ROP1 and ROP2 disposed in different sub-regions SA1 and SA2 of each sub-pixel SPXn and may be disposed across the emission area EMA.

In accordance with one embodiment, the display device 10 may include a wire connection electrode EP disposed between the first electrodes RME1 of different sub-pixels SPXn in the first sub-region SA1 from among the plurality of sub-regions SA1 and SA2 of each sub-pixel SPXn. The wire connection electrode EP may not be disposed in the second sub-region SA of the sub-pixel SPXn, and the first electrodes RME1 of different sub-pixels SPXn adjacent in the first direction DR1 may be spaced apart from each other. In the sub-pixel SPXn illustrated in FIG. 22, from among the plurality of sub-pixels SPXn, the first sub-region SA1 in which the wire connection electrode EP is disposed may be disposed on the upper side (in the drawings) of the emission area EMA, and the second sub-region SA2 may be disposed on the lower side (in the drawings) of the emission area EMA. On the other hand, in the sub-pixel SPXn adjacent to the sub-pixel SPXn shown in FIG. 22 in the first direction DR1, the first sub-region SA1 in which the wire connection electrode EP is disposed may be disposed on the lower side (in the drawings) of the emission area EMA, and the second sub-region SA2 may be disposed on the upper side (in the drawings) of the emission area EMA.

The first electrode RME1 may be spaced apart from the wire connection electrode EP with the first separation part ROP1 interposed therebetween in the first sub-region SA1. Two first separation portions ROP1 may be disposed in one first sub-region SA1. The wire connection electrode EP may be spaced apart from the first electrode RME1 disposed in the corresponding sub-pixel SPXn with a lower first separation portion ROP1 interposed therebetween and may be spaced apart from the first electrode RME1 disposed in another sub-pixel SPXn with an upper first separation portion ROP1 interposed therebetween. One second separation portion ROP2 may be disposed in the second sub-region SA2, and different first electrodes RME1 may be spaced apart from each other in the first direction DR1.

In one embodiment, the wire connection electrode EP may be connected to the first voltage line VL1 of the third conductive layer through the third electrode contact hole CTA, which penetrates the via layer VIA. The first electrode RME1 may be connected to the wire connection electrode EP, and the electric signal applied to arrange the light emitting elements ED may be applied from the first voltage line VL1 to the first electrode RME1 through the wire connection electrode EP. In the process of arranging the light emitting elements ED, signals may be applied to the first voltage line VL1 and the second voltage line VL2 and may be transmitted to the first electrode RME1 and the second electrode RME2.

A relative arrangement of the second electrode contact hole CTS may be different from that of a third electrode contact hole (e.g., a third electrode contact opening) CTA, to be described later. The second electrode contact hole CTS may be disposed at the portion of the bank layer BNL surrounding (e.g., surrounding in a plan view) the second sub-region SA2, and the third electrode contact hole CTA may be disposed in the first sub-region SA1. Because the second electrode contact hole CTS and the third electrode contact hole CTA expose the top surfaces of different voltage lines VL1 and VL2, respectively, the positions of the electrode contact holes may be determined to correspond thereto.

The bank layer BNL may surround (e.g., may extend around a periphery of) the emission area EMA and the plurality of sub-regions SA1 and SA2 similar to the above-described embodiment. The bank layer BNL may have the trench portions P disposed between the emission areas EMA of adjacent sub-pixels SPXn. In an embodiment in which the display device 10 includes the sub-regions SA1 and SA2 distinguished from each other, the areas surrounded by the bank layer BNL may be distinguished from each other. The bank layer BNL is the same as that in the above-described embodiment except that it surrounds different sub-regions SA1 and SA2.

The plurality of light emitting elements ED may be disposed on different electrodes RME between different bank patterns BP1 and BP2. The light emitting element ED may include the first light emitting element EL1 having both ends disposed on the first electrode RME1 and the second electrode branch portion RM_B2 of the second electrode RME2 and the second light emitting element ED2 having both ends disposed on the first electrode RME1 and the first electrode branch portion RM_B1 of another second electrode RME2. The first light emitting elements ED1 may be disposed on the right side with respect to the first electrode RME1, and the second light emitting elements ED2 may be disposed on the left side with respect to the first electrode RME1. The first light emitting elements ED1 may be disposed on the first electrode RME1 and the second electrode RME2, and the second light emitting elements ED2 may be disposed on the first electrode RME1 and the second electrode RME2.

The plurality of connection electrodes CNE (e.g., CNE1, CNE2, and CNE3) may include a first connection electrode CNE1, a second connection electrode CNE2, and a third connection electrode CNE3.

The first connection electrode CNE1 may have a shape extending in the first direction DR1 and may be disposed on the first electrode RME1. A portion of the first connection electrode CNE1 disposed on the first bank pattern BP1 may overlap the first electrode RME1 and may extend therefrom in the first direction DR1 to be disposed in the first sub-region SA1 located on the upper side of the emission area EMA over the bank layer BNL. The first connection electrode CNE1 may be in contact with the first electrode RME1 through the first contact portion CT1 in the first sub-region SA1.

The second connection electrode CNE2 may have a shape extending in the first direction DR1 and may be disposed on the second electrode RME2. A portion of the second connection electrode CNE2 disposed on the second bank pattern BP2 may overlap the second electrode RME2 and may extend therefrom in the first direction DR1 to be disposed in the first sub-region SA1 located on the upper side of the emission area EMA over the bank layer BNL. The second connection electrode CNE2 may be in contact with the second electrode RME2 through the second contact portion CT2 in the first sub-region SA1.

In the sub-pixel SPXn adjacent to the sub-pixel SPXn shown in FIG. 20 in the first direction DR1, the first connection electrode CNE1 and the second connection electrode CNE2 may be in contact with the first electrode RME1 and the second electrode RME2 through the contact portions CT1 and CT2 disposed in the second sub-region SA2, respectively.

The third connection electrode CNE3 may include the extension portions CN_E1 and CN_E2 extending in the first direction DR1 and a first connection portion CN_B1 connecting the extension portions CN_E1 and CN_E2. The first extension portion CN_E1 may be disposed on the second electrode branch portion RM_B2 of the second electrode RME2 while facing the first connection electrode CNE1 in the emission area EMA, and the second extension portion CN_E2 may be disposed on the first electrode RME1 while facing the second connection electrode CNE2 in the emission area EMA. The first connection portion CN_B1 may extend in the second direction DR2 on the bank layer BNL disposed on the lower side of the emission area EMA to connect the first extension portion CN_E1 to the second extension portion CN_E2. The third connection electrode CNE3 may be disposed on the emission area EMA and the bank layer BNL and may not be directly connected to the electrode RME. The second electrode branch portion RM_B2 disposed under the first extension portion CN_E1 may be electrically connected to the second voltage line VL2, and the second power voltage applied to the second electrode branch portion RM_B2 may not be transmitted to the third connection electrode CNE3.

In concluding the detailed description, those skilled in the art will appreciate that many variations and modifications can be made to the embodiments described herein without substantially departing from the aspects and features of the present disclosure. Therefore, the described embodiments of the present disclosure are to be used in a generic and descriptive sense and not for purposes of limitation.

What is claimed is:

1. A display device comprising:

a plurality of pixels comprising a plurality of emission areas;

a first electrode and a second electrode in the emission area, extending in a first direction, and spaced apart from each other in a second direction;

a bank layer extending around a periphery of the emission areas and having a plurality of trench portions between adjacent ones of the emission areas;

a plurality of light emitting elements on the first electrode and the second electrode;

a first connection electrode on the first electrode and in contact with at least one of the light emitting elements; and a second connection electrode on the second electrode and in contact with the at least one of the light emitting elements, wherein ones of the trench portions are spaced apart from each other in the first direction and are a partially depressed top surface of the bank layer, wherein each of the trench portions has a maximum width that is smaller than a length of the light emitting element, and wherein the trench portions do not overlap the first electrode and the second electrode.

2. The display device of claim 1, wherein the length of the light emitting elements is 4 μm or more, and wherein the maximum width of the trench portions is 4 μm or less.

3. The display device of claim 1, wherein the bank layer has a portion extending in the second direction and overlaps the first electrode and the second electrode, and wherein each of the trench portions does not overlap the first electrode and the second electrode.

4. The display device of claim 1, wherein a maximum thickness of the bank layer is greater than a thickness of portions of the bank layer at where the trench portions are formed, and wherein the thickness of the portions of the bank layer at where the trench portions are formed is 1.5 μm or more.

5. The display device of claim 1, further comprising a first insulating layer on the light emitting elements and the bank layer, wherein the first insulating layer has a plurality of opening holes between the emission areas and in the bank layer.

6. The display device of claim 5, wherein each of the opening holes overlaps the trench portion, and wherein the trench portion has a first trench portion overlapping the opening hole and a second trench portion spaced apart from the first trench portion and not overlapping the opening hole.

7. The display device of claim 6, wherein a distance between the first trench portion and the second trench portion is smaller than a distance between adjacent ones of the opening holes.

8. The display device of claim 5, further comprising a second insulating layer on the first insulating layer, wherein the second insulating layer overlaps each of the trench portion and the opening hole.

9. The display device of claim 5, wherein each of the opening holes does not overlap the trench portion.

10. The display device of claim 5, wherein each of the opening holes partially overlaps each of the trench portions.

11. The display device of claim 1, further comprising a lower insulating layer on the first electrode and the second electrode, wherein the bank layer and the light emitting element are directly on the lower insulating layer.

12. The display device of claim 11, wherein the first connection electrode is in direct contact with the first electrode through a first contact portion that penetrates the lower insulating layer, and wherein the second connection electrode is in direct contact with the second electrode through a second contact portion that penetrates the lower insulating layer.

13. The display device of claim 1, wherein the trench portion has a circular shape or a slit shape extending in one direction.

14. A display device comprising:

a first electrode;

a second electrode spaced apart from the first electrode;

a lower insulating layer on the first electrode and the second electrode;

a plurality of light emitting elements on the first electrode and the second electrode on the lower insulating layer and electrically connected to the first electrode and the second electrode;

a bank layer extending around a region at where the light emitting elements are arranged, the bank layer being on the lower insulating layer and having a plurality of trench portions that are partially depressed portions of a top surface of the bank layer;

a first insulating layer on the light emitting elements and the bank layer, the first insulating layer having a plurality of opening holes that do not overlap the first electrode and the second electrode;

a first connection electrode on the first electrode and in contact with the light emitting element; and a second connection electrode on the second electrode and in contact with the light emitting element, wherein the plurality of opening holes comprises an opening which overlaps one of the trench portions.

15. The display device of claim 14, wherein each of the trench portions has a maximum width smaller than a length of the light emitting element.

16. The display device of claim 15, wherein the length of the light emitting element is 4 μm or more, and wherein the maximum width of the trench portion is 4 μm or less.

17. The display device of claim 14, wherein a thickness of a portion of the bank layer at where the trench portion is not formed is greater than a thickness of portions of the bank layer at where the trench portions are formed, wherein a maximum thickness of the bank layer is 2 μm or more, and wherein the thickness of the portion of the bank layer at where the trench portions are formed is 1.5 μm or more.

18. The display device of claim 14, wherein each of the opening holes overlaps the trench portion, and wherein the trench portion has a first trench portion overlapping the opening hole and a second trench portion spaced apart from the first trench portion without overlapping the opening hole.

19. The display device of claim 14, further comprising a second insulating layer on the first insulating layer, wherein the second insulating layer overlaps the trench portions and the opening holes and is in direct contact with a top surface of the bank layer through the opening hole.

20. The display device of claim 19, wherein the first connection electrode is on the first insulating layer and the second insulating layer, and wherein the second connection electrode is between the first insulating layer and the second insulating layer.

* * * * *